(12) United States Patent
Weiss et al.

(10) Patent No.: US 9,286,186 B2
(45) Date of Patent: Mar. 15, 2016

(54) TRACE-DATA PROCESSING AND PROFILING DEVICE

(71) Applicant: Accemic GmbH & Co. KG, Kiefersfelden (DE)

(72) Inventors: Alexander Weiss, Kiefersfelden (DE); Alexander Lange, Kiefersfelden (DE)

(73) Assignee: ACCEMIC GMBH & CO. KG, Kiefersfelden (DE)

( * ) Notice: Subject to any disclaimer, the term of this patent is extended or adjusted under 35 U.S.C. 154(b) by 0 days.

(21) Appl. No.: 14/535,788

(22) Filed: Nov. 7, 2014

(65) Prior Publication Data

US 2015/0143343 A1 May 21, 2015

(30) Foreign Application Priority Data

Nov. 14, 2013 (EP) .................................... 13192942

(51) Int. Cl.
*G06F 9/44* (2006.01)
*G06F 11/34* (2006.01)
*G01R 31/317* (2006.01)
*G06F 11/36* (2006.01)

(52) U.S. Cl.
CPC ...... *G06F 11/3466* (2013.01); *G01R 31/31705* (2013.01); *G06F 11/3668* (2013.01)

(58) Field of Classification Search
None
See application file for complete search history.

(56) References Cited

U.S. PATENT DOCUMENTS

| 2010/0318752 | A1* | 12/2010 | Schwarz et al. | 711/154 |
| 2010/0318972 | A1* | 12/2010 | Xu et al. | 717/128 |
| 2013/0097462 | A1* | 4/2013 | Singh et al. | 714/39 |
| 2014/0173358 | A1* | 6/2014 | Burghard et al. | 714/45 |
| 2015/0067654 | A1* | 3/2015 | Seto et al. | 717/128 |
| 2015/0121150 | A1* | 4/2015 | Gamoneda et al. | 714/45 |

OTHER PUBLICATIONS

CoreSight Components Technical Reference Manual; ARM DDI 0314H; 2009; whole document.
CoreSight Technology System Design Guide; ARM Limited DGI 0012D; 2010; whole document.
Embedded Trace Macrocell ETMv1.0 to ETMv3.5 Architecture Specification; ARM Limited IHI 0014Q; 2011; whole document.

(Continued)

*Primary Examiner* — Philip Wang
(74) *Attorney, Agent, or Firm* — Ware, Fressola, Maguire & Barber LLP

(57) ABSTRACT

A trace-data processing device comprises an input to receive source-specific trace data streams comprising trace messages carrying execution-flow information on a program execution flow performed by a source device under test or under observation, hereinafter DUT. A trace-data processing unit (526, 1100) derives from the trace data stream runtime information associated with the program execution flow performed by the DUT. The trace-data processing unit comprises a message-distribution stage (1104), a plurality of parallel message-processing stages (1106.1, . . . 1106.N), and a result consolidation stage (1108) connected with the message-processing stages. The message-distribution stage (1104) distributes the received trace data stream (T1') over the message-processing stages in the form of respective trace data sequences. The message-processing stages (1106.1, . . . 1106.N) generate from the trace data sections runtime information sequences. The result-consolidation stage (1108) composes runtime information data representing an at least partial reconstruction of the program execution flow performed by the DUT.

15 Claims, 33 Drawing Sheets

(56) References Cited

OTHER PUBLICATIONS

IEEE—Industry Standards and Technology Organization; The Nexus 5001 Forum Standard for Global Embedded Processor Debug Interface; Version 2.0; IEEE-ISTO 5001TM-2012; Dec. 2003; whole document.

Lauterbach Development Tools, News 2011; retrieved under http://www2.lauterbach.com/doc/news11_1.pdf; 2011; whole document.

* cited by examiner

TRACE-DATA PROCESSING AND PROFILING DEVICE

CROSS-REFERENCE TO RELATED APPLICATION

This application claims priority under 35 USC §119 to European Patent Application No. 13 192 942.4 filed on Nov. 14, 2013, which application is hereby incorporated by reference in its entirety.

TECHNICAL FIELD

The present invention relates to a device and to a method for trace-data processing.

BACKGROUND OF THE INVENTION

The progress and success of a software design project rely on tools for analysis of the flow of program execution. A quick detection of defects in the software design is essential for achieving short development times.

Modern software design projects are often targeted at embedded processors, for instance in a System-on-Chip (SoC), and often times at multicore processor architectures. Wellknown embedded trace architectures for SoCs are known as the CoreSight architecture by ARM, Limited, as described in the references CoreSight™ Components-Technical Reference Manual-DDI 0314H, ARM, 2009, and CoreSight Technology System Design Guide, ARM Limited, 2010, and Embedded Trace Macrocell Architecture Specification, ARM Limited, 2011 and the Nexus standard, which is for instance used in Power Architecture® based microcontrollers designed by Freescale Semiconductor Inc. and described in detail in IEEE-ISTO, "The Nexus 5001 Forum—Standard for a Global Embedded Processor Debug Interface," IEEE-ISTO 5001TM-2012, June 2012 (December 2003).

In such systems, there is a need to comprehensively monitor the program execution flow, for instance in order to be able to detect non-deterministic errors, which may occur in such systems with high probability, and to remove the defects causing such errors.

For monitoring the program execution flow of embedded processors, embedded trace devices are used, which collect internal state information on the chip, filter it and provide a strongly compressed output containing the filtered state information. The ascertaining of trace data uses two different strategies. Trace data may be stored in the SoC and read later via a suitable interface (on-chip trace memory). As an alternative or in addition, trace data may be buffered and output shortly after they have been ascertained and then be stored outside the SoC for further processing (off-chip trace memory). Due to the limited memory capacity of SoCs, on-chip solutions are used only for very simple analyses. More comprehensive analyses require off-chip solutions.

In order to follow a program execution flow in a processor, the executed instructions, data accesses and other information have to be provided for analysis. This is done in the form of trace data forming a trace data stream.

The trace data stream is processed by a development system, which is configured to restore the program execution executed by the device under test or observation (DUT).

The bandwidth requirements for the interface providing the trace data stream from the DUT to the developer's system depend on the information to be gained from the trace data. An increasing information need has led to the use of compression techniques for trace data.

According to the current art, trace data are stored in a memory of an emulator or of a computer of a developer's system, and then analyzed offline. The program execution flow can thus be monitored over only a limited time span defined by the available storage capacity of the memory. Furthermore, the transfer of the trace data and the offline computation time accounts for an indistinct delay between the events occurring in the DUT during the program execution flow and the availability of the corresponding trace data for analysis.

SUMMARY OF THE INVENTION

In accordance with a first aspect of the present invention, embodiments of a trace-data processing device comprise an input, which is configured to receive at least one source-specific trace data stream that comprises trace messages carrying encoded execution-flow information on a program execution flow performed by a source device under test or under observation, hereinafter DUT and a trace-data processing unit, which is configured to derive from the trace data stream runtime information associated with the program execution flow performed by the DUT.

The trace-data processing unit comprises a message-distribution stage, a plurality of parallel message-processing stages, and a result consolidation stage connected with the message-processing stages. The message-distribution stage is configured to distribute the received trace data stream over the message-processing stages in the form of respective trace data sequences that include at least one trace message. The message-processing stages are each configured to generate from the trace data sections decoded runtime-information sequences associated with a respective section of the program execution flow performed by the DUT. The result-consolidation stage is configured to receive the runtime information sequences generated by the message-processing stages and to compose and provide at its output runtime information data representing an at least partial reconstruction of the program execution flow performed by the DUT. The trace-data processing device of the first aspect of the present invention enables a parallelization of trace-data processing, which in turn allows achieving an online trace-data processing of embedded processors, such as SoCs, with CPU frequencies in the range of 100 MHz, but also with very high CPU frequencies even in the GHz range, and also DUTs with multiple CPU cores. A further advantage of the trace-data processing device of the present invention is its design flexibility. In particular, the degree of parallelization of the trace-data processing device, that is, the number of parallel message-processing stages, is scalable in accordance with the particular needs of an application case of trace-data processing. In other words, the degree of parallelization implemented in the trace-data processing unit of the trace-data processing device forms a design choice. Using a suitably high degree of parallelization, the trace-data processing device even allows achieving a real-time trace-data processing in preferred embodiments, which will be described further below in more detail. However, a lower degree of parallelization that does not provide real-time capabilities still achieves an advantageous acceleration.

The trace-data processing device can be implemented with rather low hardware expenditure, as will be described in the context of preferred embodiments further below. In some embodiments, the trace-data processing device is implemented as a field-programmable gate array (FPGA) for operation at computation frequencies of program execution steps clearly lower than that of the DUT, such as several ten to several hundreds of MHz.

Even though the trace-data processing device of the first aspect of the present invention therefore has particular advantages in an online trace-data processing performed in parallel to the program execution flow of the DUT, it can also find advantageous use in an offline analysis of trace data, for example in constellations where the recording of trace data generated by a DUT is finished before the beginning of the trace-data processing. In such constellations the trace-data processing device achieves a distinctive acceleration of the trace-data processing and thus allows making the results of the trace-data processing available more quickly for inspection and further analysis by a developer.

In the following, preferred embodiments of the trace data processing device will be described.

Different DUTs differ in their provision of information regarding boundaries of consecutive trace messages in the trace data stream. Some DUT architectures provide side channel signals which mark the boundaries of trace messages in the trace data stream (e.g., the MSEO lines of the Nexus architecture). Other DUT architectures do not provide separate information on boundaries between trace messages. Rather, they periodically provide so called alignment synchronization messages (hereinafter A-Sync messages) in the trace data stream indicating the starting point of a new trace message. Depending on the content of the trace message, the length of the trace message can be computed, which allows determining the starting position of the next trace message etc. The trace data stream of both such types of DUTs also comprises instruction synchronization messages, hereinafter I-Sync messages, encoding an absolute instruction address of a respective instruction executed by the DUT. Examples of I-Sync messages are:

ARM CoreSight: I-sync packet
Nexus: "Direct Branch with Sync Message", "Indirect Branch with Sync Message", "Indirect Branch History with Sync Message" or "Synchronization Message"

In some embodiments of the trace-data processing device, therefore, the trace-data processing unit further comprises a pre-processing stage that is configured to determine starting points of the trace messages or to identify I-Sync messages in the trace data stream and to provide at its output side channel information that is associated with the trace data stream and indicative of positions of messages or of positions of instruction synchronization messages in the trace data stream.

Preferably, in such embodiments, the message-distribution stage is configured to form, using the side channel information, the trace data sequences such that each trace data sequence includes at least one instruction synchronization message. In one variant of these embodiments, the trace-data processing stages are additionally configured to determine, using the absolute instruction addresses provided by the instruction synchronization messages in the received trace data sections and by other trace messages, the absolute instruction addresses of those instructions, which were executed during the program execution flow. In another variant, the trace-data processing stages are configured to determine, in the analysis of the trace data, branch information (jump in, jump out and/or not executed). In another variant, instead of absolute instruction addresses of executed instructions, the trace-data processing stages are configured to determine, in the analysis of the trace data, information on predefined events that occurred in the program execution flow and is represented in the trace data sequences, and to output an identification of events determined as a part of the runtime information. The concept of predefined events will be explained further below by way of some examples.

In one form of these embodiments, the result-consolidation stage is configured to compose from the segmented runtime information received from the trace-data processing stages in the form of runtime information sections sorted runtime information and include it in the runtime information data provided at its output.

For reducing bandwidth requirements, the trace data stream is provided in compressed form by many DUTs. Embodiments of the trace-data processing device that allow achieving a high density of information on the program execution flow using a small bandwidth have an input that is configured to receive and internally forward the received trace data stream comprising the trace messages carrying the execution-flow information in compressed form. In such embodiments, the trace-data processing unit is configured to decompress the execution-flow information using prestored reconstruction information, which comprises a representation of at least a fraction of a copy of a memory content of a memory of the DUT, the memory content representing program code executable by the DUT. This prestored reconstruction information is in one variant provided in an internal reconstruction memory that forms a part of the trace-data processing device. In another variant, this reconstruction memory is an external memory connected with or connectable to the trace-data processing device.

Preferably, in the trace data processing device the compressed reconstruction information includes at least branch-instruction information indicative of that an instruction at a respective current instruction address is a branch instruction. A branch instruction is any instruction that controls the flow of program execution to proceed with an instruction other than a respective next instruction in the executable program code. Preferably, the branch-instruction information for a branch instruction at a respective current instruction address additionally comprises either branch-offset information indicative of at least one of the following:

an address offset between the respective current instruction address and an instruction to be jumped to from the respective current instruction address in the program execution flow, and an instruction offset between the respective current instruction and an instruction to be jumped to from the respective current instruction in the program execution flow.

The address or instruction offset may be negative, corresponding to a "jump back". The address or instruction offset may be zero in special circumstances.

An example for a zero branch offset is a while (1) loop. In C-Code:

```
void main (void)
{
        InitSystem( );
        while(1)
    {;}
}
In ASM-compilation:
_main:
    bl _InitSystem
_I1:
    b _I1
    nop
```

In one such embodiment, the reconstruction information is prestored in mapped form in a coherent memory-address range of a reconstruction memory that is either internal or external to the trace-data processing device. The trace-data processing unit of this embodiment comprises a mapper, which is connected with the trace-data processing stages and configured to map the instruction addresses received from the trace-data processing stages to the coherent memory-address range of the memory. In absence of memory mapping, the reconstruction memory range must include the memory range from the lowest to the highest instruction address (including any gaps in between). If there is, for example, an instruction memory section from 0x00001000 to 0x00001FFF and another section from 0x10000000 to 0x10000FFF, the reconstruction memory range must be from 0x00001000 to 0x10000FFF, and the required size of the memory is 0x10000000 or 268.435.456 bytes. In contrast, in the present embodiment with memory mapping the reconstruction memory range must include only the instruction memory in use. The section from 0x00001000 to 0x00001 FFF can be mapped to 0x00000000 to 0x00000FFF; the section from 0x10000000 to 0x10000FFF can be mapped to 0x00001000 to 0x00001 FFF, and the required size is 0x2000 or only 8192 bytes.

In case the DUT uses an instruction set with variable length, the reconstruction information preferably includes length information indicative of lengths of the current instruction or the length of the next following instructions.

This accelerates the processing because it reduces the number of memory accesses during the reconstruction of the program execution flow.

Some DUTs do not provide information on a data access type in the trace data. In order to allow analyzing the program execution flow of those DUTs also with respect to data accesses, the reconstruction information of some embodiments additionally comprises data-access information regarding the instruction at the current instruction address and indicative of only one of a read-type and a write-type, with respect to a data access to be executed by the DUT to a data memory of the DUT. This embodiment is additionally very effective in the coding of the reconstruction information because it is saves coding effort that would be required to individually and separately identify read-type and write-type accesses. In one example, only a read-type access is identified, which allows identifying a write-type access by the fact that it is identifiable as a data access, for instance by a data trace packet output after an the execution of a given instruction, which is not identified as a read-type access. In a variant forming another example, only a write-type access is identified, which allows identifying a read-type access by the fact that it is identifiable as a data access, for instance by a data trace packet output after an the execution of a given instruction, which is not identified as a write-type access.

In an alternative to such embodiments, information regarding the instruction at the current instruction address with respect to a data access to be executed by the DUT to a data memory of the DUT distinguishes explicitly between a read-type access and a write-type access. This makes the analysis of the trace data more comfortable to the user.

In embodiments suitable for analyzing trace data streams of this type, each message-processing stage of the trace-data processing device is configured to determine from the received at least one instruction synchronization message the respective instruction address, and to determine from the received at least one trace message and provide as an output the runtime information sequences in the form of at least one of a Jump-in information element, a Jump-out information element, or a Not-executed information element, each of those in combination with a respective instruction address, to which the respective information element is allocated.

In order to allow an easier analysis of the program execution flow in the DUT, the reconstruction information in some embodiments additionally comprises event information indicative of an identification of an event, to which an execution of the instruction at the current instruction address is allocated, in accordance with a prestored list of events, which are related to the execution of selected steps defined as such events in the program execution flow in the DUT. The concept of events was mentioned above already and will be explained in the following by way of some examples. Events are in one alternative output without a related instruction address. In another alternative the instruction address is provided together with an identifier of the event. The advantages of providing predefined events for the trace data analysis will be described in more detail further below in the context of other embodiments. In the present context, the use of events is described by way of some examples. For instance, regarding the first alternative, information on events output may take the form of "Event 202" only, reporting an occurrence of, for example, an execution of the instruction at address 0x80010, which is predefined as "Event 202". An example for the other alternative is providing the output in the form "Event202 (0x80010)", reporting the occurrence of the execution of the instruction at address 0x80010. In systems according to the prior art, an address match detection is done by address comparators. Each event requires its own comparator. In case of multiple events (hundreds, thousands) there are many resources required for implementation of the comparators. In contrast, using the predefined events, as enabled by preferred embodiments of the trace-data processing device, the amount of resources can be reduced and it is possible to support an arbitrary amount of events.

Preferably, in such embodiments of the trace-data processing device, each message-processing stage is configured to additionally determine from the received trace message, using the reconstruction information and the list of events, any event formed by an executed instruction currently processed, and to provide an event identification element in association with the instruction execution information for the respective executed instruction in the runtime information section. This allows restricting a desired analysis to predefined events, optionally including a time stamp indicating the time of occurrence of the event.

In order to reduce the frequency of access to the reconstruction memory containing the reconstruction information, the trace-data processing device of some embodiments has a reconstruction memory, in which the reconstruction information additionally comprises action-offset information associated with each instruction address, the action-offset information being indicative of either an instruction address offset between the current instruction address and an instruction address of a next branch instruction, of a next data-access instruction or of a next event, in accordance with the event information, in the program execution flow, or an instruction offset corresponding to the number of instructions between the current instruction and a next branch instruction, a next data-access instruction or a next event in the program execution flow.

In such embodiments of the trace-data processing device, each message-processing stage is preferably configured to determine from the action-offset information that is associated with a currently processed instruction an instruction address of an instruction to be processed next by the message-processing stage.

In further preferred embodiments of the trace-data processing device, the message-processing stages are configured to generate and provide at their output the runtime information comprising at least one of the following information:

jump-out information indicative of an instruction address of an instruction that executed a jump out;

jump-in information indicative of an instruction address of an executed instruction subject to a jump in;

not-executed information indicative of an instruction address of a non-executed instruction; this is a short representation of a jump-out followed by a jump-in at an instruction next after the instruction subject to the jump-out;

event information indicative of an instruction address of a predefined event executed in the program execution flow;

waypoint information indicative of an instruction address of a waypoint in the program execution flow;

clock-cycle information indicative of a number of processor clock cycles of the DUT between two executed events;

a current context identifier of an instruction executed;

a current instruction set to which an instruction executed belongs;

any exception detected in executing a given instruction;

timestamps associated with instructions; and timestamps associated with trace data messages a data trace comprising a value, a memory address and an access type, read or write, associated with a memory access.

A further embodiment of the trace data processing device comprises a trace memory, which is configured to receive and store either parts of the trace data stream or the complete trace data stream from the frame processing unit, parts of the runtime information generated by the trace data processing unit or the complete runtime information generated by the trace data processing unit, and, optionally, side channel information from the trace data processing unit.

In one variant, read and write access to the trace memory and operation of the trace memory is controlled by a runtime information processing unit. Additional access and control is possible in another variant by a development system.

In one embodiment that achieves a particularly large processing speed by enabling a high degree of parallelization of the trace message processing, the message-distribution stage is configured to assign a unique sequence identifier to each of the distributed trace data sequences and to distribute the trace data sequences to a plurality of parallel buffer memories, which are connected on their output side with the message-processing stages, and to select a respective buffer memory for a given trace data sequence from those of the buffer memories, which currently have buffer-capacity for the given trace data sequence. In this embodiment, the message-processing stages are preferably configured to provide at their output side the respective sequence identifier in association with the runtime information sequence determined from a given trace data sequence received on their input side. In one variant of these embodiments, the message-processing stages are additionally configured to indicate to the result-consolidation stage an availability of at least one generated runtime information sequence identifier.

Further gain in processing speed for DUTs with trace messages that do not provide direct information on the boundaries between trace messages can be achieved by a special form of pre-processing. The trace-data processing device of preferred embodiments comprises a pre-processing stage with a speculative-message-computing stage that comprises a group of N parallel data evaluators and that is configured to receive a sequence of the trace data stream and to evaluate the given sequence of the trace data stream using the data evaluators in the form N partially overlapping evaluation windows that together cover the given sequence of the trace data stream, beginning with an evaluation starting point of a first one of the evaluation windows. In these embodiments, each of the data evaluators is preferably configured to evaluate in its respective evaluation window a respective subsection of the given section starting with a predefined respective offset evaluation starting point with respect to its next neighbouring evaluation window and having a width, which is equal to or larger than a predefined maximum message length. The offset between the evaluation starting points of next neighbouring evaluation windows is one data step size, which in typical embodiments is 1 Byte, but in some other embodiments is more than 1 Byte, and in further embodiments is less than 1 Byte. Each evaluator is preferably configured to perform, for its given evaluation window, a message-type identification algorithm on the respective subsection beginning from the respective offset evaluation starting point, and to provide as an output either a message-type indicator, which is indicative of a message type that has been successfully identified as beginning with the respective offset starting point, which thus forms a message starting point, or an indicator of a message-identification failure.

The pre-processing stage of such embodiments in one variant preferably further comprises a message-starting point computing stage, which is configured to receive the outputs of the speculative-message-computing stage and detect message-type indicators of predefined messages including at least an alignment synchronization message, which indicates a suitable starting point for message evaluation in the trace data stream, and associated message starting points received from the speculative-message-computing stages for a respective current sequence of the trace data stream. The message-starting point computing stage is in some of these embodiments further configured to determine predefined message lengths associated with the currently detected synchronization message types in units of data step size, to determine offset starting points of respective next messages in the trace data stream, determine a carry value corresponding to a difference between the length of the identified message closest to an end point of the currently processed sequence and a distance, in terms of data step size, between the offset starting point of this identified message and the end point of the currently processed sequence, and to determine the starting point of a next message in a next sequence of the trace data stream from the carry value.

A further gain in processing speed is achieved by embodiments of the trace-data processing device, in which the pre-processing stage described above is configured to pipeline the pre-processing of consecutive sequences of the incoming trace data stream in consecutive pipe stages of a pre-processing pipeline, wherein each pipe stage comprises a speculative-message-computing stage and a message-starting point computing stage, and wherein the message-starting point computing stages of the pipe stages are configured to provide the carry value and an indicator of detection of an alignment synchronization message in the respective sequence of the trace data stream as an output to the respective next pipe stage.

Further embodiments of the trace-data processing device are concerned with improvements in frame processing. This is particularly useful for analyzing DUTs with a complex architecture, in which different processor cores and other units (e.g. bus trace, hardware supported instrumentation) form different sources of trace data, which are provided in the form of an integrated single trace data stream. To solve this challenge, preferred embodiments further comprise a frame processing unit, which is arranged upstream from the trace-data processing unit and which is configured to receive a serial comprehensive trace data stream that includes a plurality of source-specific trace data streams originating from more than one trace-data source, to locate predefined source identifiers in the comprehensive trace data stream and extract the trace data allocated thereto so as to form a plurality of source-specific trace data streams, to internally align at least one of the source-specific trace data streams so as to remove any gaps caused by extracting sections of the trace data stream originating from a respective other trace data source, and to provide at its output separate the trace data streams for each respective trace data source.

Improvement in processing speed is also achieved in embodiments of the trace-data processing device, wherein the prestored reconstruction information is provided in redundant instances in a memory unit comprising the reconstruction memory in the form of a plurality of parallel memory banks or memory devices, and wherein a memory-arbiter is connected between the trace-data-processing unit and the memory unit and configured to serve simultaneous access requests received from the message-processing stages by controlling a plurality of simultaneous accesses to the different instances of the different instances of the reconstruction information. In preferred embodiments of this type the memory unit also comprises a cache unit with a plurality of parallel cache memories configured to cache redundant instances of a fraction the reconstruction information stored in the reconstruction memory, and a cache-arbiter is connected between the trace-data-processing unit and the cache unit and configured to serve simultaneous access requests received from the message-processing stages by controlling a plurality of simultaneous accesses to the different instances of the different instances of the fraction of the reconstruction information.

The trace-data-processing device of other preferred embodiments also comprises a profiling unit, which is connected with the result-consolidation unit and configured to determine from the received runtime information profiling information comprising at least a number of repetitions of execution of instructions at predetermined instruction addresses in the program execution flow performed by the DUT. The trace-data-profiling unit of some of these embodiments comprises a cache counter unit and is configured to perform cache write and cache rewrite operations of counts of execution associated with instruction addresses executed to the cache counter unit, and upon detecting that no cache capacity exists for a current cache-write operation, initiate a memory write or memory rewrite operation to an external memory for that count, which is associated with that instruction address that has not been counted for the longest time span, and to then overwrite that count by the current cache write operation. A memory-write stores the count currently in the cache to the memory, and a memory-rewrite adds the count currently in the cache to the count currently stored in the memory.

The cache counter unit preferably has a plurality of parallel counter caches. In such embodiments, the trace-data-profiling unit is configured to perform cache write and cache rewrites for counts related with the same instruction address to different ones of the counter caches, and to add all those cache counts from the different counter caches that are associated with the same instruction address before initiating a memory write or memory rewrite operation in order to determine a currently cached total count with respect to that instruction address.

A preferred embodiment of the trace-data-processing device implements the frame-processing unit, trace-data processing unit and the trace-data profiling unit in the form of a field-programmable gate array.

A second aspect of the present invention is formed by a method for operating a trace-data processing device, the method comprising:
receiving at least one source-specific trace data stream that comprises trace messages carrying encoded execution-flow information on a program execution flow performed by a source device under test or under observation, hereinafter DUT;
deriving from the trace data stream runtime information associated with the program execution flow performed by the DUT,
distributing the received trace data stream in the form of respective trace-data sequences that include at least one trace message over a plurality of parallel message-processing stages, wherein the message-processing stages generate, from the trace-data sections, decoded runtime information sequences associated with a respective section of the program execution flow performed by the DUT,
composing and providing as an output runtime information data representing an at least partial reconstruction of the program execution flow performed by the DUT from the runtime information sequences generated by the message-processing stages.

Embodiments of the method comprise additional method features implemented in embodiments of the trace-data processing device of the first aspect of the present invention A third aspect of the invention that is independent from the first and second aspects of the invention is formed by a method for an online processing of trace data that comprises one or more source-specific trace data streams, the method comprising
identifying trace synchronization messages and trace messages, both summarized hereinafter by the term "message", separately for each source-specific trace data stream, by
iteratively performing a respective trace data evaluation stage for each source-specific trace data stream, including performing a predefined message-type identification algorithm for detecting a presence of a message and its message type in a given section of the respective trace data stream, and
iteratively performing a respective trace-data processing stage based on the results of the message-type identification algorithm performed in the trace data evaluation stage, including using predefined length information about a respective identified message type for determining a starting point of a respective next message;
wherein performing a respective iteration of the trace data evaluation stage comprises
using a group of N partially overlapping evaluation windows that together cover the given section of the trace data stream, beginning with an evaluation starting point of a first one of the evaluation windows,
each of the evaluation windows evaluating a respective subsection that has a width, which is equal to or larger than a predefined maximum message length, and that has a predefined respective evaluation offset starting point at a distance of one data step size with respect to a neighbouring evaluation window, which data step size is equal to or smaller than a predefined minimum message length, wherein, for each given evaluation window at a respective iteration, evaluating comprises performing the message-type identification algorithm on the respective subsection beginning from the respective offset starting point, and providing as an output either a message-type indicator, which is indicative of a message type that has been successfully identified as beginning with the respective offset starting point, which thus forms a message starting point, or an indicator of a message-identification failure, and performing a next iteration of the trace data evaluation stage on a next section of the trace data stream beginning at a next evaluation starting point that is at a distance of N times the evaluation offset from the previous starting point.

A preferred embodiment of the method comprises performing a given iteration of the trace-data processing stage in parallel to performing the next iteration of the trace data evaluation stage. Further embodiments of the method comprise additional method features implemented in embodiments of the trace-data processing device of the first aspect of the present invention.

A fourth aspect of the invention is formed by a trace-data processing device of a second kind, comprising an input, which is configured to receive at least one source-specific trace data stream that comprises trace messages carrying encoded execution-flow information on a program execution flow performed by a DUT;

a trace-data processing unit, which comprises a pre-processing stage that is configured to determine starting points of the trace messages and to provide at its output side channel information that is associated with the trace data stream, and a message processing unit, which is configured to interpret the trace messages based on the received side channel information.

Some embodiments of the trace-data processing device of the second kind do not comprise a message-distribution stage, in contrast to the trace-data processing device of the first aspect of the invention. Further embodiments of the trace-data processing device of the second kind comprise additional features as provided in the embodiments of the trace data processing device described hereinabove. In particular additional features of the trace-data processing unit and of the message processing unit correspond to those described in the context of the previous and subsequent description of embodiments.

In the following, further embodiments will be explained with reference to the enclosed drawings.

DESCRIPTION OF EMBODIMENTS WITH REFERENCE TO THE DRAWINGS

Prior Art

Figure 1:
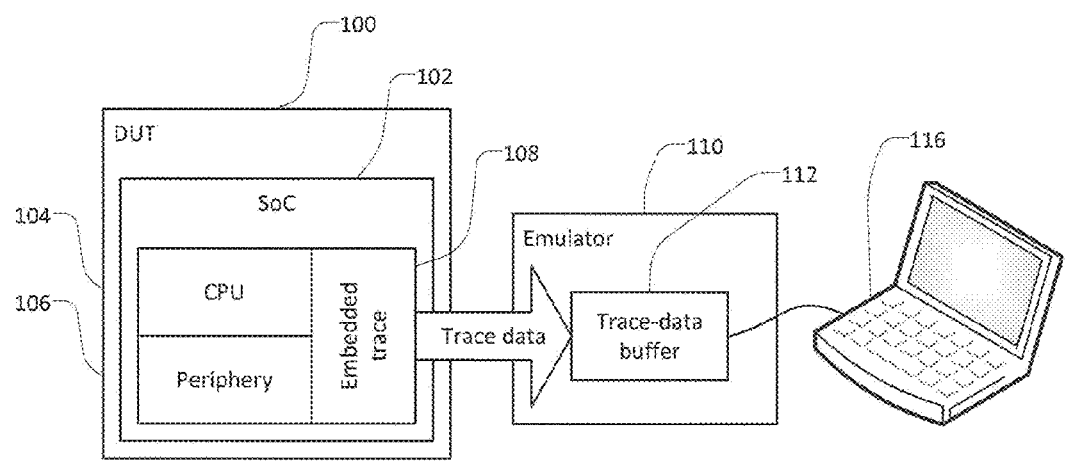
FIG. 1 shows an arrangement of a device under test and an emulator in a simplified block diagram.

FIG. 1 shows an arrangement of a device under test and an emulator in a simplified block diagram. The arrangement of FIG. 1 is as such known in the prior art. The arrangement comprises a device under test 100, which comprises an embedded processor in form of a System-on-Chip (SoC) 102. The embedded processor comprises a central processing unit 104, which is connected with periphery units summarized by block 106. The processor and the periphery are connected with an embedded trace unit 108. The embedded trace unit 108 collects internal state information of the central processing unit 104 and the periphery, filters and provides a stream of trace data in compressed form at its output to an emulator 110. The emulator comprises a trace-data storage device 112, which receives the stream of trace data and performs recording of the trace data received. The buffered trace data are read out and computed by a PC 116. Thus, no trace-data processing is performed by the emulator 110. Trace data processing is performed only in the PC 116. Results of trace data computation are for instance the history of executed instructions, data accesses or task switches.

Figure 2:
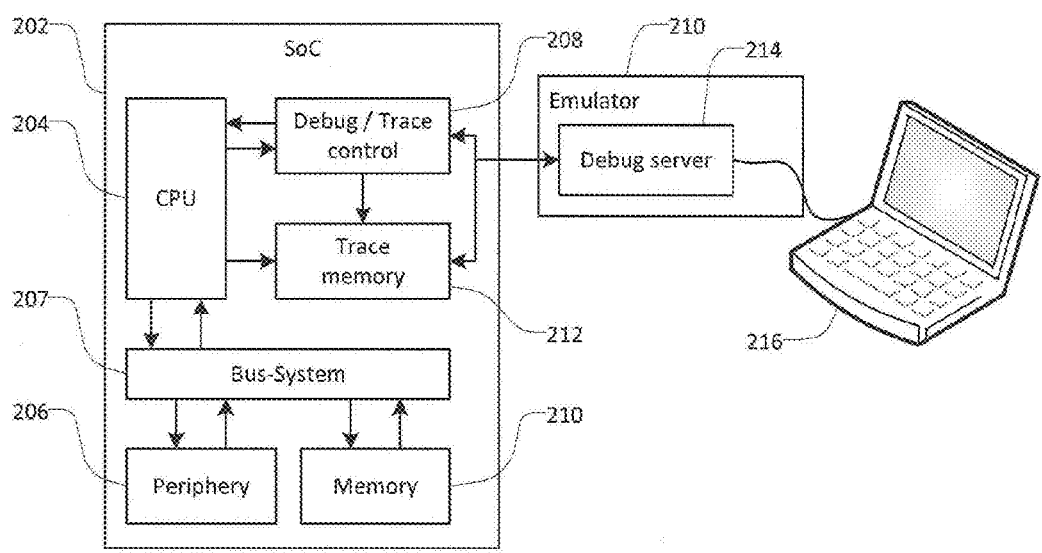
FIGS. 2 and 3 show simplified block diagrams of alternative arrangements for generating and processing trace data.
Figure 3:
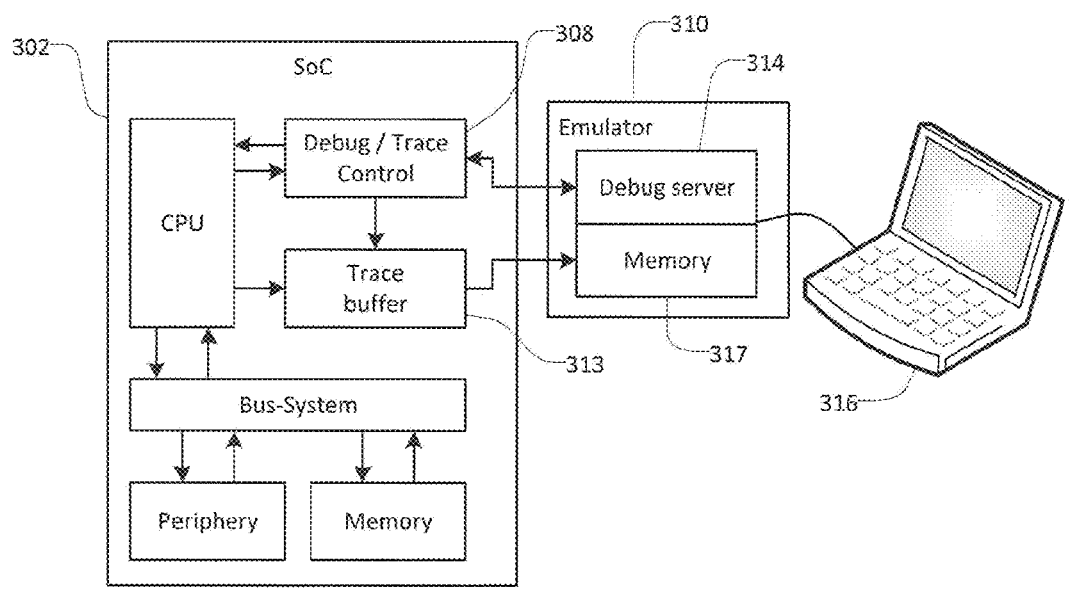

Ascertaining trace data can be performed following two different strategies, which are illustrated in FIGS. 2 and 3. FIGS. 2 and 3 show simplified block diagrams of alternative arrangements for generating and processing trace data. FIG. 2 comprises a SoC 202 in a DUT. The SoC 202 comprises a CPU 204, which is connected to a periphery unit 206 via a bus system 207. An embedded debug and trace control unit 208 is connected with the CPU and with the periphery unit 206 as well as with a memory 210 via the bus system 207. Furthermore, the SoC 202 comprises an on-chip trace memory 212. As in the arrangement of FIG. 1, the SoC 202 is connected with an emulator 210, which comprises an integrated debug server unit 214, which in turn is connected with a developer's system 216 in the form of a computer. In this architecture, the trace data are stored on-chip in the trace memory 212. The debug server forms an interface between the SoC 202 and the trace-data processing PC 216. The memory capacity that can be provided by the trace memory 212 in the SoC 202 is limited.

FIG. 3 shows a simplified block diagram of an alternative arrangement according to the prior art. Reference numerals used in the figure correspond to those used in FIG. 2 for corresponding units, except for the first digit, which is a "3" instead of a "2". The following description focuses on the differences of the arrangement of FIG. 3 in comparison with the arrangement of FIG. 2. In contrast to the SoC 202, the SoC 302 of FIG. 3 does not have a trace memory, but only a trace buffer. The trace buffer 313 serves for short-term intermediate buffering of trace data generated by the embedded trace unit 308. The emulator 315 additionally comprises a memory 317 for storing the trace data received from the embedded trace unit 308 and the trace buffer 313. Due to the scalability of the trace memory 317, most currently known arrangements for trace-data processing rely on an off-chip configuration, as shown in FIG. 3. Depending on the information to be derived from the trace data, a trace interface between an embedded processing system, such as the SoCs 102, 202 and 302 and a developers system, different band widths have to be provided. For a simple instruction trace without cycle accuracy, an average of 1.2 bits per executed instruction has to be transferred via the interface (CoreSight Technology System Design Guide Rev. D, ARM 2010, table 5-1). In case the number of clock cycles required for performing the respective instructions is to be provided as an output, the required band width strongly increases. For monitoring data transfers, not only the transferred data but also the pertaining addresses have to be transmitted to the trace-data processing device, requiring an average of 40 bits per data transfer. Data transfers are separated into read and write operations. For monitoring a SoC, results of read accesses are particularly interesting. An average rate of read accesses is about 20%, resulting in an average additional band width requirement of 8 bits per instruction. An average of additional 40 Bits are to be transferred at each data access, and a 20% probability of a data access results in an additional average bandwidth requirement of 8 Bit/instruction.

Techniques of trace data compression aim at reducing the average band width requirements. For a continuous recording of a trace, it is necessary to consider worst-case scenarios. Some unfavorable sequences of jumps and accesses to data let the required band width increase distinctively. Therefore, the design of a trace interface requires providing sufficient buffer capacity and reserve.

Bandwidth Requirements

Figure 4:
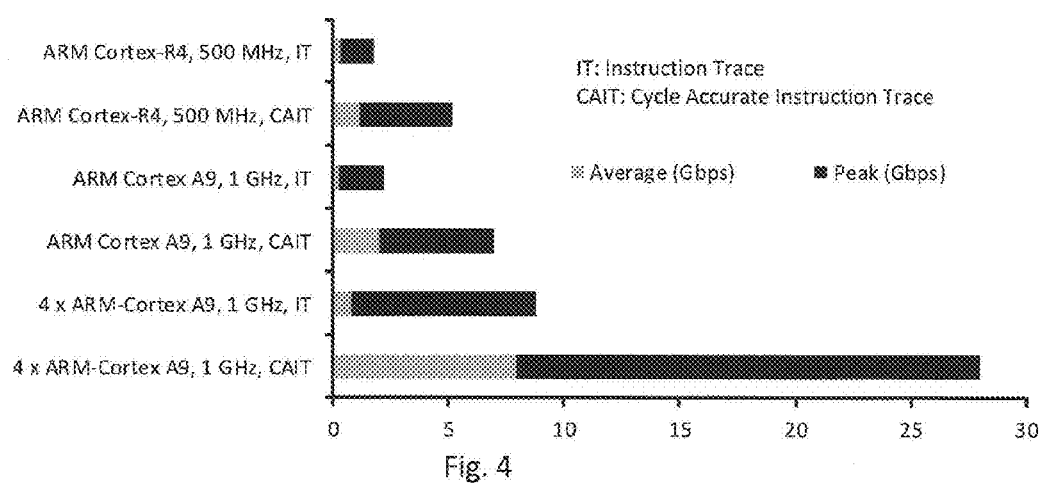
FIG. 4 shows a diagram illustrating a band width requirement for different example DUTs.

FIG. 4 shows a diagram illustrating the band width requirement for different example DUTs listed in vertical arrangement along the y-axis of the diagram. The diagram is based on content provided in the document "Lauterbach Development Tools, News 2011", retrieved under http://www2lauterbach.com/doc/news11_1.pdf. The abbreviation "IT" associated with a respective listed DUT indicates that the DUT provides an instruction trace, which is not precisely in accordance with the cycles of the embedded processing device. The abbreviation "CAIT" stands for a sample, which does provide an instruction trace, which is precisely in accordance with the cycles of the embedded processor. It can be seen that there is a strong difference between the average band width requirement in gigabit per second and the observed peak value of the band width requirement. Peak value is by far higher than the average values and reaches a maximum of approximately 28 Gbps for an embedded processor comprising 4 CPU cores operating with a frequency of 1 GHz. The average band width requirement for this sample DUT amounts to approximately 8 Gbps.

System Overview

Figure 5:
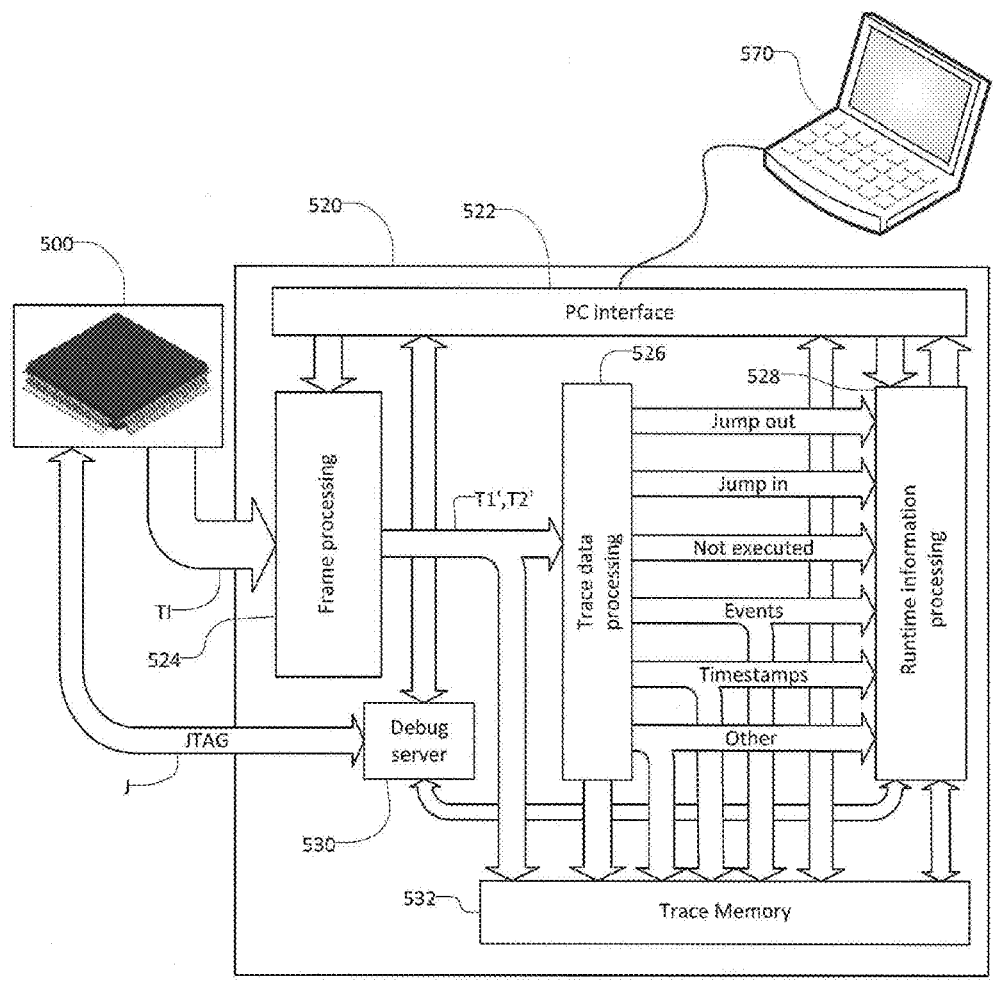
FIG. 5 is a schematic diagram of an arrangement of a trace-data processing device connected to an external DUT and an external development system. The trace-data processing device may also represents an embodiment of a trace-data processing device of the second kind.

FIG. 5 is a schematic diagram of an arrangement of a device under test with a trace-data processing device 520 and a development system.

The trace-data processing device 520 forms an embodiment of the trace-data processing device, and of the trace data processing device of the second kind.

The DUT 500 and the trace-data processing device 520 are connected via a trace-data interface TI and an debug control interface, for instance an JTAG interface J. The debug control interface is optional, and not present in a variant of the present embodiment. The trace data processing device 520 and the development system 570 are connected via a PC interface 522 (for instance USB or Ethernet) of the trace-data processing device 520. The trace-data processing device 520 comprises a frame-processing unit 524, a trace-data processing unit 526, a runtime information processing unit 528, and a debug server unit 530. The frame-processing unit 524 provides an initial processing of trace-messages received in a trace data stream via the trace-data interface. The trace-data processing unit is functional in deriving from the trace data stream runtime information associated with the program execution flow performed by the DUT 500. The trace data stream received by the frame-processing unit 524 may comprise trace-messages received from different sources, such as different processor cores comprised by the DUT 500. The frame processing unit is configured to separate the trace data stream into a corresponding number of source-specific trace data streams T1', T2' and to forward these source-specific trace data streams individually to the trace-data processing unit 526 and to the optional trace memory 532. The trace-data processing unit 526 may be provided in a plurality of instances, performing the tasks of the trace-data processing unit in parallel. FIG. 5 schematically indicates exemplary set of runtime information derived by the trace-data processing unit 526. This exemplary set comprises jump-out addresses, jump-in addresses, not-executed addresses, events, time stamps, and other information. This exemplary set of runtime information derived by the trace-data processing unit 526 may be modified in different embodiments according to the particular requirements of an application case. Any of the above-mentioned type of runtime information may be omitted from the set. This will be further elucidated further below in the context of the description of different implementations of the trace-data processing unit 526.

The runtime information processing unit 528 receives the runtime information provided by the trace-data processing unit 526 and further processes it to derive profiling information or other runtime information processing. In one preferred embodiment, the runtime information processing unit 528 is configured to control the DUT via the debug server.

A trace memory 532 serves for storing either parts of the trace data stream T1', T2', or the complete trace data stream T1', T2', optionally in combination with side channel information SC (FIG. 15), and/or parts of the runtime information generated by the trace data processing unit 526, or the complete runtime information generated by the trace data processing unit 526, for further analysis by the development system 570. The trace memory 532 can be accessed via the PC interface 522. Recording of the trace data and of the runtime information is controlled by the runtime information processing unit 528. The trace memory is in one variant of the present embodiment organized as a ring buffer, and in another variant in the form of multiple ring buffers, which enables the storage of multiple segments of trace data or runtime information. In a further variant of the present embodiment using multiple ring buffers, the trace memory has configurable filters, which qualify the input data to be stored in one or more of the internal ring buffers.

Depending on detected system states and other parameters such as e.g., a change of the observation focus of the DUT, the runtime information processing unit 528 is configured to perform one or more of the following operations:
a) command the debug server
  to modify register and memory values of the DUT, in particular a modification of the debug/trace control unit for dynamically changing the observation focus
  read register and memory values from the DUT
  control the program execution of the DUT, in particular start or stop at least one CPU.
b) trigger an output of signals by external devices (not shown) to influence the DUT, to control other devices connected on the DUT (e.g., put a motor control unit into a safe state if a malfunction of the DUT is detected, trigger test routines by detecting specific system states of the DUT)
c) control the trace memory 532 to freeze a specific ring buffer in case of the detection of a specific system state or modify the input filters of the trace memory
d) output log information, including events, timestamps, execution times, sequences of data accesses in the DUT, higher abstraction levels than events and other. Finally, the debug-control unit serves for controlling the program execution flow and the provision of trace data by the DUT via the JTAG interface.

Hardware Implementation

Figure 6:
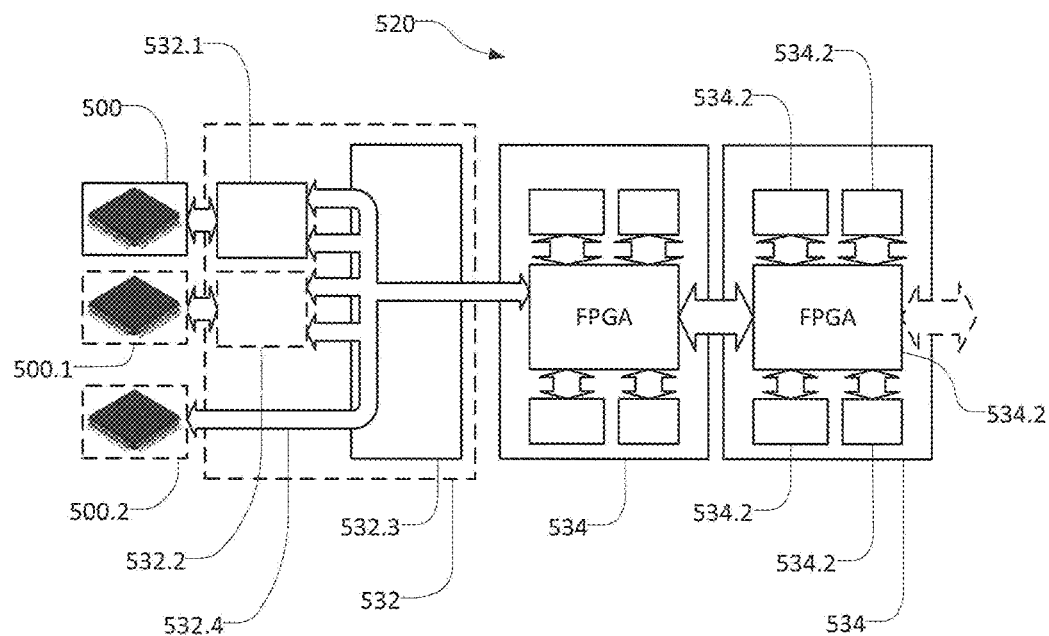
FIG. 6 shows another embodiment of a trace-data processing device in an arrangement with at least one external DUT.

An example of a hardware implementation of the trace-data processing device 520 of FIG. 5 is shown in FIG. 6. FIG. 6 shows the trace-data processing device 520 in an arrangement with at least one DUT 500. Optionally, further DUTs 500.1 and 500.2 may be connected.

For connection to any DUT, the trace-data processing device comprises an interface unit 532. The interface unit 532 of the present embodiment comprises a set of parallel interfaces for connecting to different DUTs in parallel. Two interfaces 532.1 and 532.2 are implemented as trace pods. The trace pods provide differential output signals to a front module 532.3 of the interface unit 532. A further interface 532.4 is a direct interface, which provides for connectability to a DUT via a broadband electrical or optical cable connection. The front module 532.3 provides initial signal processing of the electrical or optical signals received via the trace pods 532.1 and 532.2 or the cable connection 532.4. It is noted that the particular design of the interface unit 532 may be varied for implementing different embodiments. For instance, the number of interfaces for connecting DUTs may be smaller or larger than that shown in FIG. 6. In some variants, the trace pods are provided as an integral part of the trace-data processing device 520. In other embodiments, at least one trace pod is connectable to the front module 532.3, but is not provided as an integral part of the trace-data processing device 520. The trace pods may be implemented by using FPGAs or in another form of hardware, such as application specific integrated circuitry (ASIC). Depending on the application case, only one or several types of connection may be supported by the front module 532.3.

The trace-data processing device 520 further comprises a number of computing modules 534. The number of computing modules varies between different embodiments, depending on the requirements of the particular application case. Each of the computing modules comprises an FPGA 534.1, and optionally in addition a set of main memories 534.2. In embodiments supporting a particularly high band width, the main memories 534.2 are DDR3, RLDRAM3 or similar high-performance memories, each comprising multiple memory banks (not shown).

The following description of FIGS. 7 to 10 provides a more detailed explanation of different embodiments of a trace-data processing device varying in the design of the frame-processing unit, which forms the first stage in processing incoming trace data, cf. FIG. 5.

Frame Processing

In most application cases, a frame-processing unit is required only if the incoming stream of trace data includes trace data originating from different sources, such as different CPU cores in a multicore-SoC. The frame processing unit serves for separating the incoming integrated trace-data stream into separate individual source-specific trace-data streams.

Figure 7:
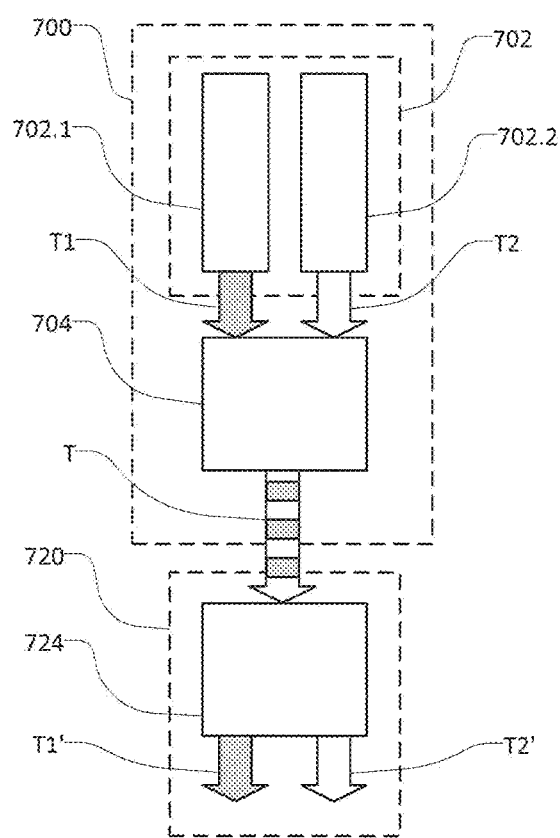
FIGS. 7 to 10 illustrate different embodiments of a trace-data processing device varying in the design of the frame-processing unit, which forms a first stage in a processing of incoming trace data.

A first example of an arrangement of a frame-processing unit 724 of a trace-data processing device according to the present invention in connection with an external DUT 700 is shown in FIG. 7. In this case, the DUT 700 comprises a SoC 702 with two separate CPU cores 702.1 and 702.2. Each of the CPU cores 702.1 and 702.2 provides an individual trace-data stream. The source-specific trace-data streams are merged into a single trace-data stream in a DUT interface unit 704. The single trace-data stream is provided as an output of the DUT 700 and as an input to the trace-data processing device, which is subsequently received by the frame-processing unit 724. As will be explained in more detail further below in the context of the description of FIG. 10, the frame-processing unit of the embodiment of FIG. 7 serves for identifying and extracting payload data from the trace data stream, to separate the source-specific trace-data of the identified payload data into source-specific channels and to rearrange the data within the source-specific trace-data streams, which are then provided at the output of the frame-processing unit 724. The present embodiment represents for instance the case of processors with multiple cores by ARM with an on-chip debug and trace solution according to the CoreSight architecture, in which the interface unit 704 is referred to as a Trace Port Interface Unit.

Figure 8:
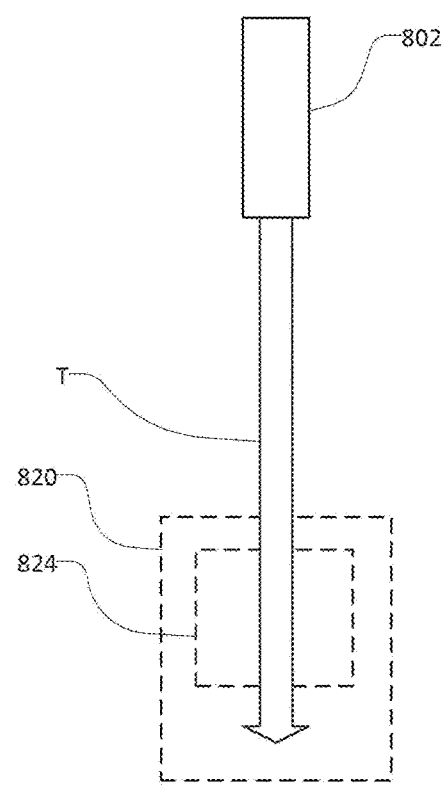

FIG. 8 represents an embodiment of a trace-data processing device, which is capable of processing trace-data received from a single source, such as a SoC 802 carrying a processor with a single core. In this case, a frame-processing unit is not required and may be omitted. However, a variant does comprise a frame-processing unit 824, as indicated by a block with a dashed outline, which is configurable to operate in either an active mode corresponding to the functionality described in the context of FIG. 7, or in a transparent mode. In the transparent mode, the frame-processing unit is functional only in transparently forwarding the incoming trace data stream to the subsequent units of the trace-data processing device. In an alternative variant, which is not shown here, the frame-processing unit can be deactivated and is avoided by the trace-data stream by means of providing a shortcut to the subsequent trace-data processing unit 526 shown in FIG. 5.

Figure 9:
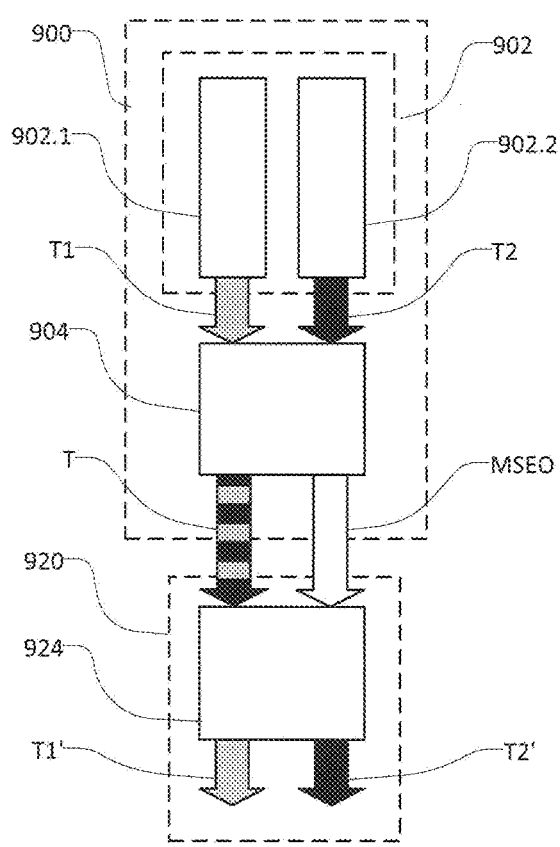

FIG. 9 shows a further embodiment of a trace-data processing device 920 with a frame-processing unit 924 in connection with an external DUT 902 having a SoC with a CPU having two different cores 902.1 and 902.2. As in the embodiment of FIG. 7, the external DUT 900 has an interface unit 904, which integrates the two source-specific trace-data streams originating from the cores 902.1 and 902.2 into a single trace-data stream T. In contrast to the embodiment of FIG. 7, the DUT interface unit 904 provides an additional separate output of message start/end output signals (MSEO). This separate side channel provides the trace-data processing device 920 with information required to determine the starting point and the end point of trace-messages combined in the trace-data stream T. The functionality of the frame processing unit 924 is otherwise as described for the frame processing unit 724 of the embodiment of FIG. 7.

The configuration shown in FIG. 9 corresponds for instance to the case of a trace-data processing device that is configured for processing and analyzing trace data from a multicore processor configured in accordance with the Nexus interface standard, as implemented for instance in Freescale SoCs. The DUT interface unit 904 in this case corresponds to a Nexus port interface.

In one variant, the source-specific trace data are sorted in accordance with the respective source in a sequential manner in the frame-processing unit 724, 924. This implies that several clock cycles are required for processing a current frame. In another variant that accelerates the processing at this point, the frame processing unit is provided in the form of a processing pipeline. This way, the frame-processing unit can process a new frame with each clock cycle, e.g., a frame illustrated under the reference label TF in FIG. 10. This solution requires more hardware effort for implementing the pipelined frame-processing unit, for in the form of combinatorial circuitry.

Figure 10:
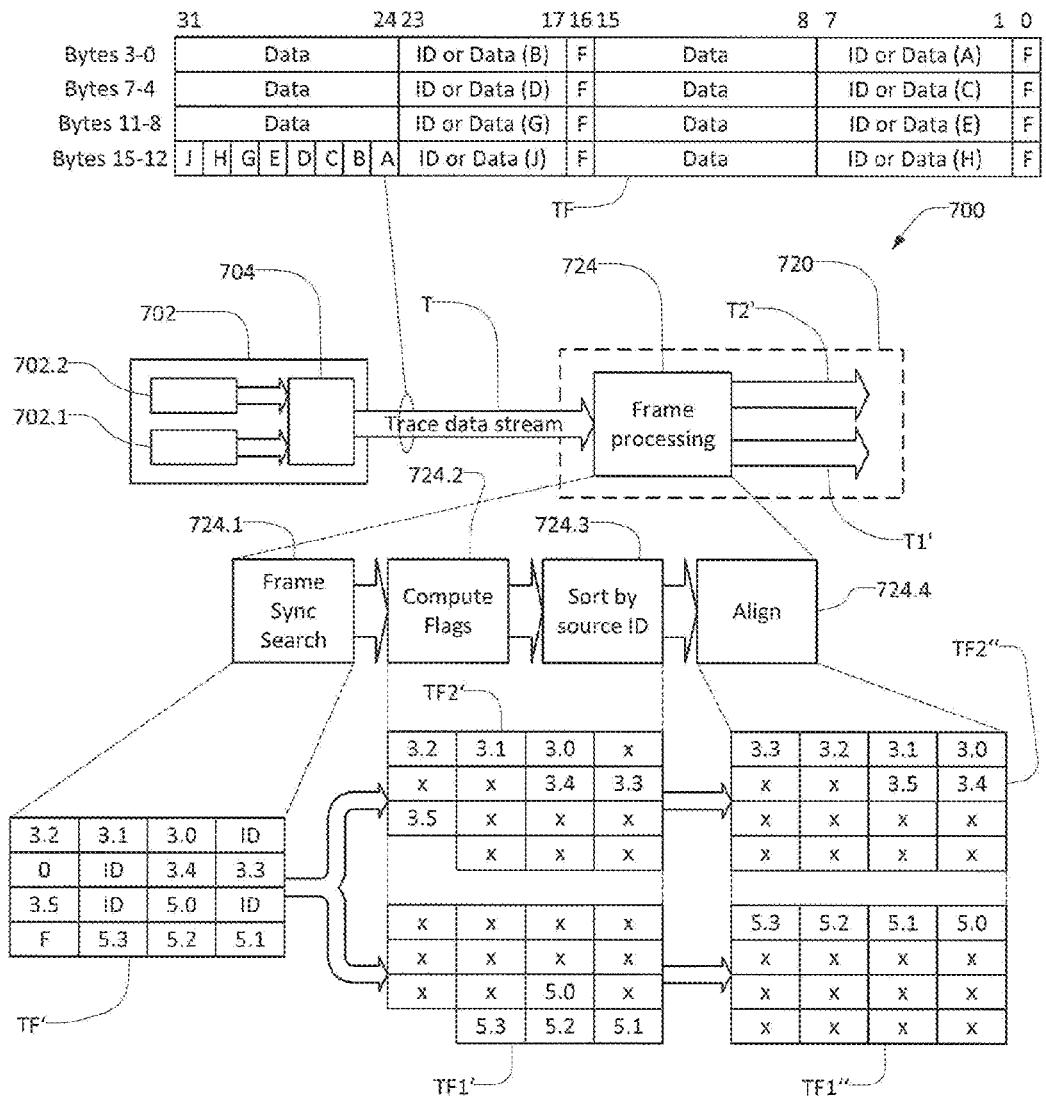

FIG. 10 is an illustration providing more detail on an arrangement according to FIG. 7. The illustration shows an embodiment of the trace-data processing device 720 with more detail of the frame-processing unit 724. As already explained in the context of FIG. 7, the frame-processing unit 724 receives a merged trace data stream from the DUT 700 via its DUT interface unit 704. An example of a frame structure that is used in the merged trace data stream is shown under the reference label TF. This example corresponds to the frame structure according to the CoreSight™ architecture specification V2.0, published by Arm Limited, p. D4-129. The frame comprises 16 Bytes, which are represented in FIG. 10 in table form. The first line of the table comprises, in four columns to be read from right to left, Bytes 0 to 3, the second line comprises Bytes 4 to 7, the third lines comprises 8 to 11, and the fourth line comprises Bytes 12 to 15.

The change of a source ID is indicated in certain control bits (Bit 0 in the bytes 0, 2, 4, 6, 8, 10, 12 and 14). In case Byte 0 indicates the change of the source ID, the control bit A is set to 0, indicating that Byte 1 corresponds to the new source ID. The new source ID takes effect from the next data Byte after Byte 1. If the control bit A is set to 1, Byte 1 corresponds to the old source ID. Similar settings may be used in the other bits B to J of Byte 15, which refer to different bytes 2, 4, 6, 8, 10, 12 and 14 of the frame TF. If the flag F is 0, the source ID is not changed and the Flags A,B,C,D,E,G,H and J contains the Bit 0 of data value contained in the bytes 2, 4, 6, 8, 10, 12 and 14.

The frame-processing unit 724 comprises four sub-units 724.1 to 724.4, which are configured to perform subsequent steps in the frame-processing tasks of the frame-processing unit 724. A first stage 724.1 is configured to search and identify synchronization frames in the merged trace data stream T, which allows to identify the beginning of frames TF, which carry payload data. The synchronization frames are output periodically between frames and are for instance identifiable by a pre-defined sequence of bits. In one example, this pre-defined sequence of bits is a sequence of a "0" followed by 31 "1", which fulfills the criterion of being unique, in order to distinguish the frame synchronization packet from other packets. At the output of the frame identification unit 724.1, individual frames, such as the frame TF', are provided. The frame TF' is an exemplary frame of the frame structure shown by the reference frame TF. It comprises trace data from the two different sources, the processor cores 702.1 and 702.2 of SoC 702. Bytes carrying the respective identification are marked by ID and are followed by Bytes carrying payload data, i.e. source-specific trace data received from the respective processor core. Flags for interpretation of the ID changes are comprised in the Byte 16, as explained above for the reference frame structure TF.

In a flag-computing unit 724.2 arranged downstream from the frame-identification unit 724.1, the flags of the identified frames are evaluated, and separate frames are generated for each source ID in a data-sorting unit 724.3. The generated internal frames are marked by reference labels TF1' and TF2'. Subsequently, in an alignment unit 724.4, the generated source-specific frames are internally aligned to remove any empty Bytes created by removing control and identification Bytes as well as removing payload data of other sources. This leads to the output of the processed source-specific trace-data frames TF1" and TF2" at the output of the alignment unit 724.4, which are then provided as an output of the frame-processing unit 724 as to separate aligned and source-specific trace-message streams T1 and T2.

Message Processing Flow

Figure 11:
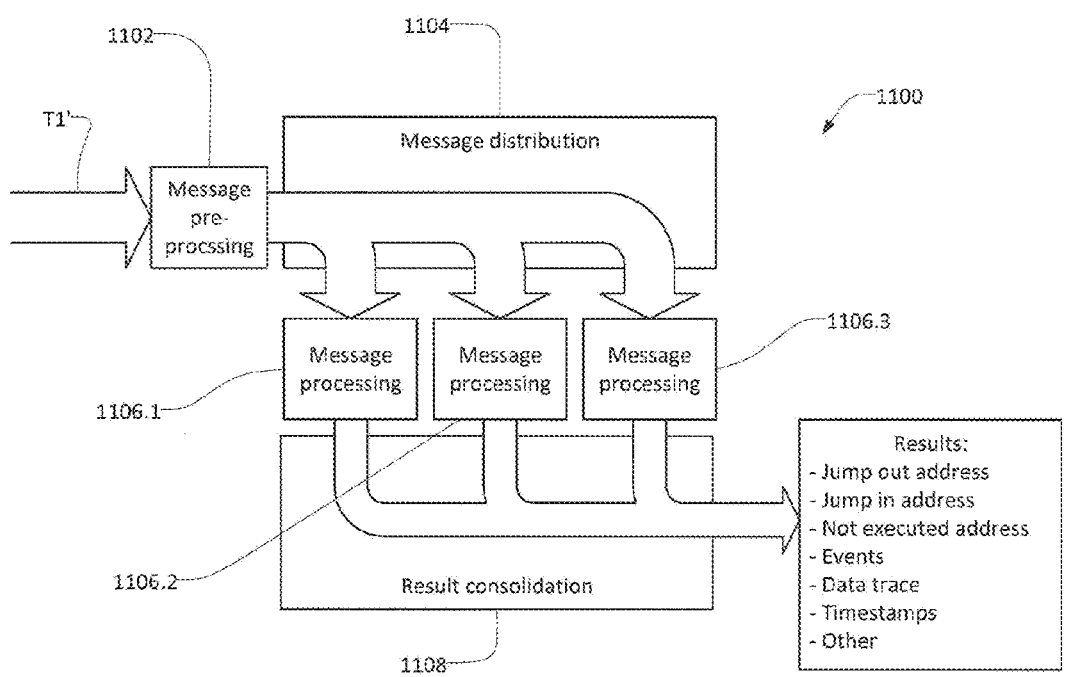
FIG. 11 is a schematic block diagram illustrating an internal structure and a processing flow in a trace-data processing unit, which forms a second stage in a processing of incoming trace data in an embodiment of the trace-data processing device in accordance with the general structure of embodiments of the trace-data processing device shown in FIG. 5.

FIG. 11 is a schematic block diagram indicating the internal structure and the processing flow in the trace-data processing 1100 of an embodiment of the trace-data processing device in accordance with the general structure of preferred embodiments of the trace-data processing device 520 shown in FIG. 5.

The present example is not an example of the trace-data processing device of the second kind. For that, reference is made to FIG. 30.

From FIG. 5, it can be seen that the trace-data processing unit 1100 forms a particular implementation of the trace-data processing unit 526, and thus a second stage in the processing flow within the trace-data processing device 500.

The input of the trace-data processing unit 1100 is configured for receiving a source-specific trace-message stream.

For the purpose of the present illustration, it is assumed that the incoming trace-message stream is the stream T1' shown in the previous figures. The incoming trace-message stream T1' is subjected to pre-processing in a message-preprocessing stage 1102, which forms a first stage of the trace-data processing unit 1100. A message-distribution stage 1104 is configured to distribute sections of the incoming trace-message stream to a plurality of parallel message-processing stages, which together form a message-processing unit 1106 and a third stage of the trace-data processing unit 1100. In the present example, three parallel message-processing stages 1106.1 to 1106.3 are shown. The number of message-processing stages is scalable in accordance with requirements of the particular application case. Output data provided by the message-processing stages 1106.1 to 1106.3 is received by a result-consolidation stage 1108, which forms a fourth stage of processing within the trace-data processing unit 1100. In the result consolidation stage, the trace-data received from different message-processing stages 1106.1 to 1106.3 message-processing unit 1106 are sorted and output to a buffer of subsequent units. In addition, in one embodiment the respective last instruction addresses calculated in the message-processing unit are compared with the instruction address transferred in the instruction synchronization message of the following segment. This way, in case they are identical, a consistency of the address calculation is confirmed.

Details of the functionality of these stages shown in FIG. 11 will be explained with reference to the following FIGS. 12 to 14.

Message Pre-Processing

Figure 12:
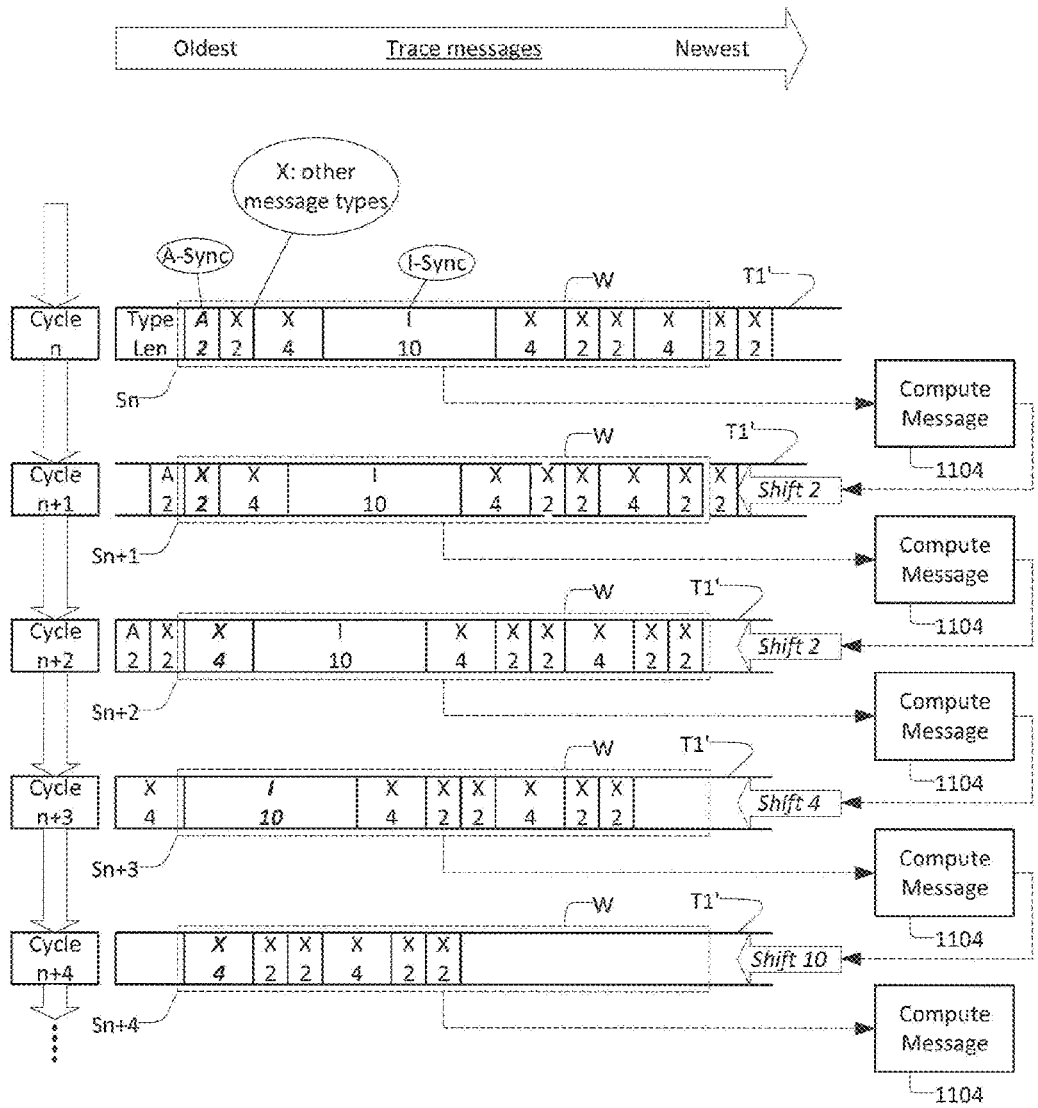
FIG. 12 is an illustration of the functionality performed by a message-preprocessing stage in a trace-data processing unit, such as that of FIG. 11.

FIG. 12 is an illustration of the functionality performed by the message-preprocessing stage 1102. The message-preprocessing stage 1102 is configured to determine starting points of the trace-messages and to identify, in the trace-data stream T1', instruction synchronization messages (I-Sync messages). The I-Sync messages provided in the trace-data stream encode absolute instruction addresses of instructions executed by the DUT. This operation is required in embodiments of the trace-data processing device, which are to be used in arrangements shown in FIGS. 7 and 8. In such application cases, given for instance when analyzing trace-data received from a DUT implementing an ARM CoreSight architecture, no side-channel information is received that allows separating the individual trace-messages comprised by the trace-data stream T1'.

In FIG. 12, the trace-data stream T1' to be processed by the message-preprocessing stage 1102 is shown with structural detail that initially is not known to the trace-data processing device. It is to be ascertained by the message-preprocessing stage 1102. The trace-message stream T1', for exemplary purposes, is shown to have several messages. Messages labeled by the capital letter "A" in the line labeled "Type" are A-Sync messages. A-Sync messages are alignment synchronization messages indicating the starting point of a new trace-message. The capital letter "T" indicates messages of other message types. The capital letter "I" is indicative of I-Sync messages. I-Sync messages encode an absolute instruction address of a respective instruction executed by the IDUT. In a ARM CoreSight architecture, I-Sync messages are formed by I-Sync packets. A second line labeled "LEN" in the graphical representation of the trace-message stream T1' contains the values of the length of the respective messages. Individual messages are separated by vertical lines. As mentioned, the message-preprocessing stage serves for identifying the structure of the trace-message stream T1', i.e. starting points of individual trace-messages. In order to find a starting point for analyzing a continuous trace-message stream, the A-Sync messages are identified first. A-Sync messages are for instance identifiable by a pre-defined sequence of bits. In one example, this pre-defined sequence of bits is a sequence of 8 zeros, which fulfills the criterion of being unique, in order to distinguish A-Sync messages from other messages.

Next, I-Sync messages are identified in the trace-message stream T1' by the message-preprocessing unit 1102. To this end, the message-preprocessing unit operates with an evaluation window W that covers a pre-defined input width of the trace-message stream T1'. The input width is equal or larger to the maximum possible message length.

After identifying the A-Sync message using a data evaluator 1104 comprised in the message-preprocessing stage, the evaluation window W processed by the data evaluator 1104 is shifted by two Bytes, namely, the length of the identified A-Sync message. This terminates an evaluation cycle n and initiates an evaluation cycle n+1, which is graphically represented below the evaluation cycle n. The evaluator 1104 starts computing to identify the message beginning at the shifted starting point Sn+1 of the evaluation window W. As a result, a message of type T and length 2 is identified, which terminates the evaluation cycle n+1 and leads to a next evaluation cycle n+2. In the evaluation cycle n+2, the evaluation window W is shifted to the starting point Sn+2 derived from the length of the message identified in the cycle n+1. After identifying the message type and length 4 of the message, the data evaluator 1104 performs a next cycle n+3, in which an I-Sync message of length 10 is identified, followed by a cycle n+4, in which a message of type T and length 4 is identified. This processing continues. As can be seen, in order to interpret a sequence of messages, the respective end of the preceding message has to be known. Assuming that for the processing of a message one clock cycle is required, the maximum processing band width for a trace-message stream can be calculated from the length of the shortest message and the processing frequency of the data evaluator 1104, which may for instance be implemented as a FPGA. Assuming that the clock cycle is C=100..200 MHz and a minimum length of a trace-message to be 1 Byte, a trace-bandwidth of 8 bit/10 ns amounts to 0.8 Gbit/s. This trace-bandwidth may not be sufficient in some application cases. In order to accelerate the processing and to provide a higher trace-bandwidth, the message-preprocessing unit is provided in a variant as shown in FIG. 13.

Figure 13:
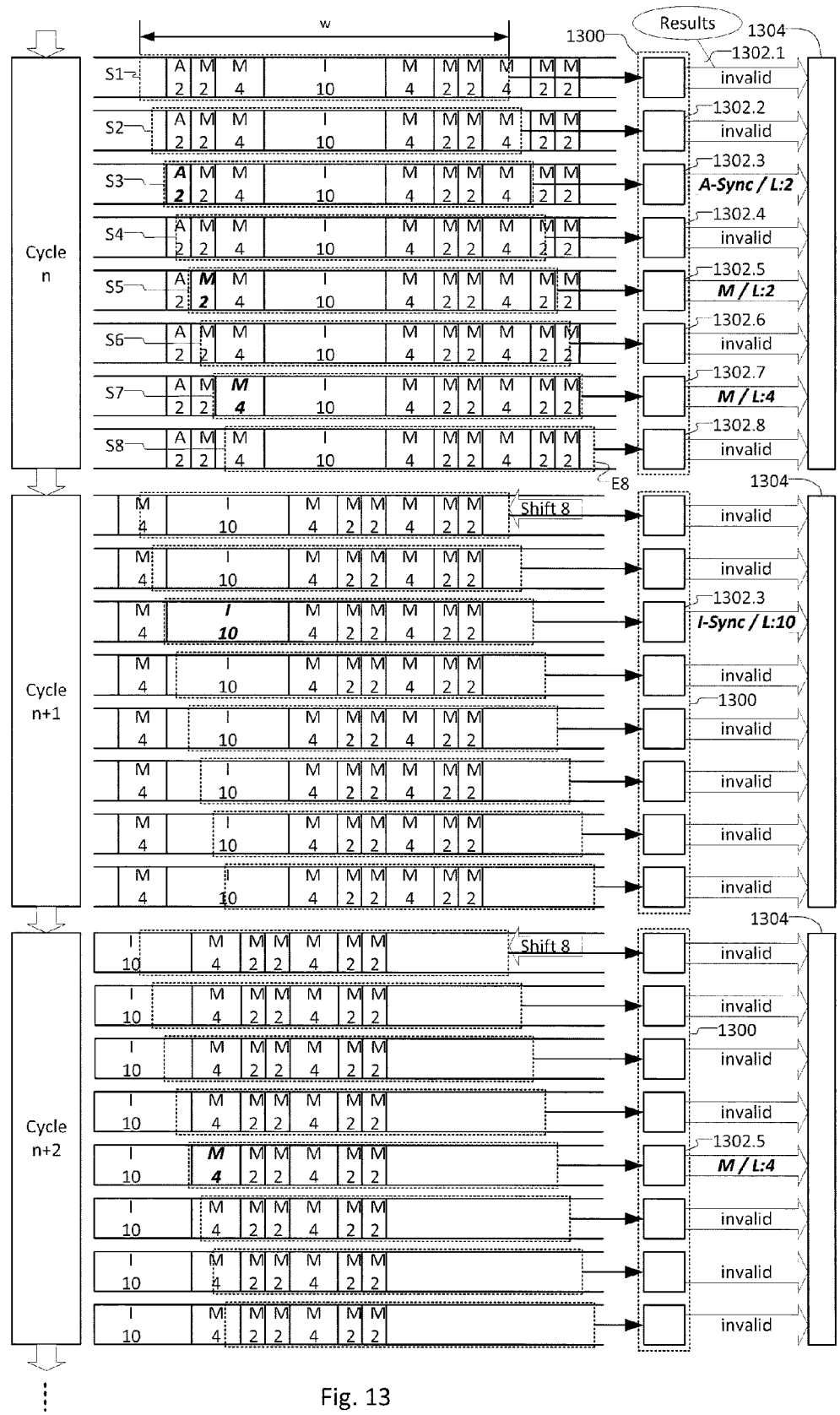
FIG. 13 is an illustration of a message-preprocessing performed by a message-preprocessing unit in accordance with a preferred variant of a trace-data processing device.

FIG. 13 is an illustration of a message-preprocessing performed by a message-preprocessing unit in accordance with a preferred variant of a trace-data processing device.

The processing principle, on which the message-preprocessing is based, is a speculative computation of a length and a type of trace-data comprised in partially overlapping evaluation windows, irrespective of whether the evaluation window has an evaluation starting point at the correct beginning of a message or not.

To this end, the pre-processing stage of the present variant comprises a group of parallel data evaluators 1302.1 to 1302.8. In the present exemplary configuration of the pre-processing stage, a speculative-message-computing stage with 8 parallel data evaluators is provided. The number of parallel data evaluators varies in different embodiments. Using more parallel data evaluators allows accelerating the evaluation process further. Using a smaller number of data evaluators is also an option.

Each of the parallel data evaluators 1302.1 to 1302.8 of the speculative-message-computing stage is configured to receive the same sequence of the trace-data stream. This is illustrated in FIG. 13 by 8 illustrations of the same exemplary section of the source-specific trace-message stream T1' received from the frame-processing 524. Each of the data evaluators 1302.1 to 1302.8 evaluates a defined section of the trace-message stream corresponding to a respective evaluation window W1 to W8 with separate starting points $S_1$ to $S_8$. All evaluation Windows W1 to W8 have the same width w. The width w of the individual evaluation windows is set to be equal to or larger than a maximum message length that can be expected from the trace-message stream. In the present example, the width w of the evaluation windows W1 to W8 is 32 Byte. The starting points of the evaluation windows are shifted with respect to each other. In the present example, the offset between the evaluation starting points of next neighboring evaluation windows W1 to W8 is 1 Byte. This offset depends on the trace message stream alignment, which is 1 Byte in this example. Thus, the eight overlapping evaluation windows W1 to W8 together cover a given sequence of 40 Byte of the stream of trace-messages, beginning with the evaluation starting point S1 and ending with the evaluation end point E8 of the evaluation window W8.

Each of the data evaluators 1302.1 to 1302.8 is configured to evaluate in its respective evaluation window of the evaluation windows W1 to W8 a respective subsection of the illustrated section of the incoming trace-message stream, starting with the respective evaluation starting point S1 to S8. The identification algorithm performed by the data evaluators is based on a recognition of predefined data patterns of a given set of trace-messages provided by the DUT. The data evaluators 1302.1 to 1302.8 operate in parallel, as follows: For its given evaluation window of the evaluation windows W1 to W8, each of the data evaluators performs a message-type and message length identification algorithm on the respective subsection covered. Furthermore, each of the data evaluators 1302.1 to 1302.8 provides an output, which is an indicator of an identified message type and the identified message length. If the evaluation starting point is not on the correct beginning of a message an invalid or wrong message type will be detected. However, that is not relevant because, in a regular evaluation execution flow, this invalid message information will never be used.

Thus, the processing of the present variant of the message-preprocessing unit is based on performing parallel attempts to identify a trace-message starting from each Byte within a processing width defined by the arrangement of the processing windows W1 to W8 with respect to the trace-message stream. Some of the data evaluators will not be able to identify a trace-message or they identify a wrong message type because their evaluation window has a starting point in the midst of a trace message. In the present example, the data evaluators 1302.1, 1302.2, 1302.4, 1302.6 and 1302.8 cannot identify a trace-message, because the respective evaluation windows have starting points that do not coincide with starting points of a trace-message. However, the data evaluators 1302.3, 1302.5 and 1302.7 successfully identify respective trace-messages. The data evaluator 1302.3 identifies an A-Sync message. The data evaluator 1302.5 identifies a subsequent trace-message of a type indicated by the label T. The data evaluator 1302.7 identifies another message, which is also labeled as T and assumed to be known to have a length of 4 Byte. The results of the data evaluators are provided to a message-starting point computing stage 1304.

It is noted that the results of the data evaluators 1302.1 to 1302.8 are provided in parallel after only one clock cycle of computation. Thus, the message-starting point computation stage 1304 receives in parallel all outputs of the data evaluators and uses the successful message identifications provided by some of the data evaluators to determine the message lengths, at least for the currently detected synchronization message types, in particular alignment synchronization messages, such as the A-Sync message identified by the data evaluator 1302.3. From that, the message-starting point computing stage determines offset starting points of respective next messages in the trace-message stream.

In a preferred embodiment achieving a very high processing speed, the message-starting point computing stage and the speculative-message-computing stage 1300 are provided in the form of pipeline stages. In this embodiment the computation done in the message-starting point computing stage 1304 for a given cycle of the overall evaluation of the trace-message stream is performed in parallel to the data evaluation of the trace-message stream for the next cycle performed in the data evaluators 1302.1 to 1302.8 of the speculative-message-computing stage 1300. I.e., these parallel operations concerning consecutive operation cycles are performed at the same time on different sections of the trace-message stream, which are shifted by 8 Byte with respect to each other.

This cyclic and pipelined operation principle is illustrated in FIG. 13 by showing the progress of evaluation for three cycles n, n+1 and n+2. In the middle section of FIG. 13, the processing for the cycle n+1 is illustrated. It can be seen that the starting point S1 of the window W1 in the cycle n+1 is shifted by 1 Byte with respect to the starting point S8 of the window W8 in the previous cycle n. The processing in the cycle n+1 leads to the identification of an I-Sync message, which is determined to have a length 10 by the message-starting point computation stage 1304. In the cycle n+2, the processing of the trace-message stream proceeds as described, and leads to the identification of a message of message type T by the data evaluator 1302.5, which is then determined to have a length of 4 Byte in the message-starting point computing stage 1304.

Figure 14:
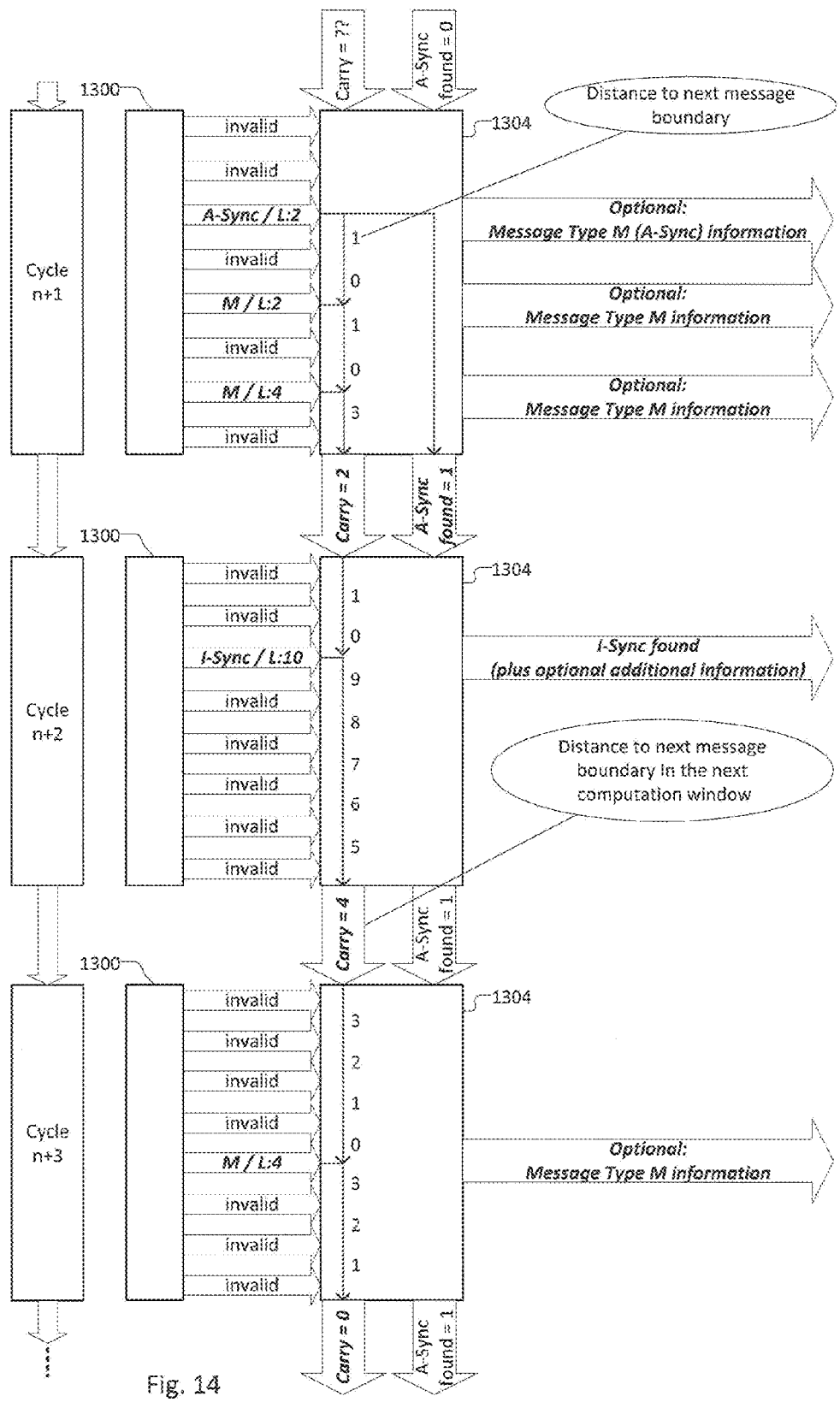
FIG. 14 is a schematic block diagram of an embodiment of a pre-processing stage.

FIG. 14 is a schematic block diagram of the pre-processing stage, showing in particular the speculative-message-computing stage 1300 and the message-starting-point computing stage 1304. The illustration of FIG. 14 deviates from a pure structural representation to also illustrate a process flow carried out by these two units of the pre-processing stage. To this end, the illustration of the units is repeated vertically in three rows, indicating three different consecutive processing stages, as shown on the left-hand side of the Figure and indicated as cycles n+1, n+2, and n+3. Thus, the illustration of FIG. 14 is an alternative illustration of the embodiment of FIG. 13.

As mentioned in the context of FIG. 13, the message-starting-point computing stage 1304 uses the inputs received from the different data evaluators 1302.1 to 1302.8 of the speculative-message-computing stage 1300 and detects message-type indicators of the predefined messages. Starting from a first identified alignment synchronization message (A-Sync) and its associated message starting point, the message lengths associated with the currently detected synchronization message types are used to determine offset starting points of respective next messages in the trace data stream. Furthermore, a carry value is determined, corresponding to a difference between the length of the identified message closest to an end point of the currently processed sequence and a distance between the offset starting point of this identified message and the end point of the currently processed sequence. The carry value serves to determine a starting point of a next message that is to be found in a next sequence of the trace-data stream.

In particular, in a pipeline implementation, the search for instruction synchronization messages (I-Sync) is performed in parallel. This method allows to continuously process incoming trace-messages. The achieved processing band width results from the clock rate of the evaluation logic, the smallest trace message stream alignment and the number of speculative computations performed in parallel.

Assuming a number of 32 parallel data evaluators, a trace date stream alignment of 1 Byte and a processing time of one clock cycle as illustrative example results in a processing band width of 8 bit/10 ns·32=25.6 GBit/s.

Figure 15:
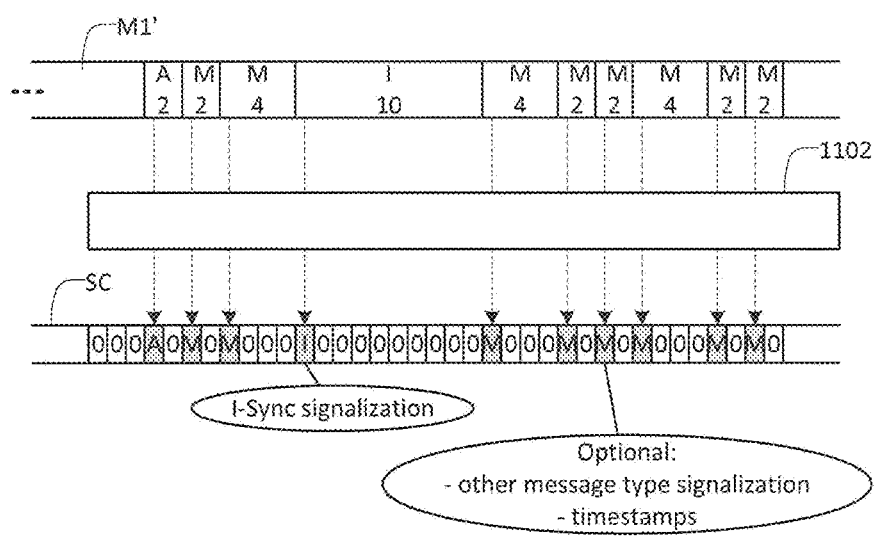
FIG. 15 is an illustration of a process of generating side-channel information from the determination of the message type and the message starting point in the pre-processing stage according to the embodiments of FIGS. 11 to 14.

FIG. 15 is an illustration of the process of generating side-channel information from the determination of the message type and the message starting point in the pre-processing stage 1102 according to the embodiments of FIGS. 11 to 14. For an incoming source-specific trace message stream T1' received by the pre-processing stage 1102, a parallel stream of side-channel information SC is generated by the pre-processing stage 1102. The side-channel information stream indicates the starting positions and message types of the identified messages. In one embodiment, only the detection of instruction synchronization messages I is indicated in the stream SC of side-channel information. In another embodiment, other message types T are also reported in the stream of side-channel information SC. In a further variant, time stamps are added to indicate a time of reception of the respective trace-data.

The embodiments of FIGS. 12 to 15 are concerned the identification of messages in a trace-data stream in application cases, where the DUT does not provide corresponding side-channel information allowing an immediate identification of borders between messages and an immediate identification of message types. One such application case are DUTs based on the ARM CoreSight architecture.

Message Distribution

Figure 16:
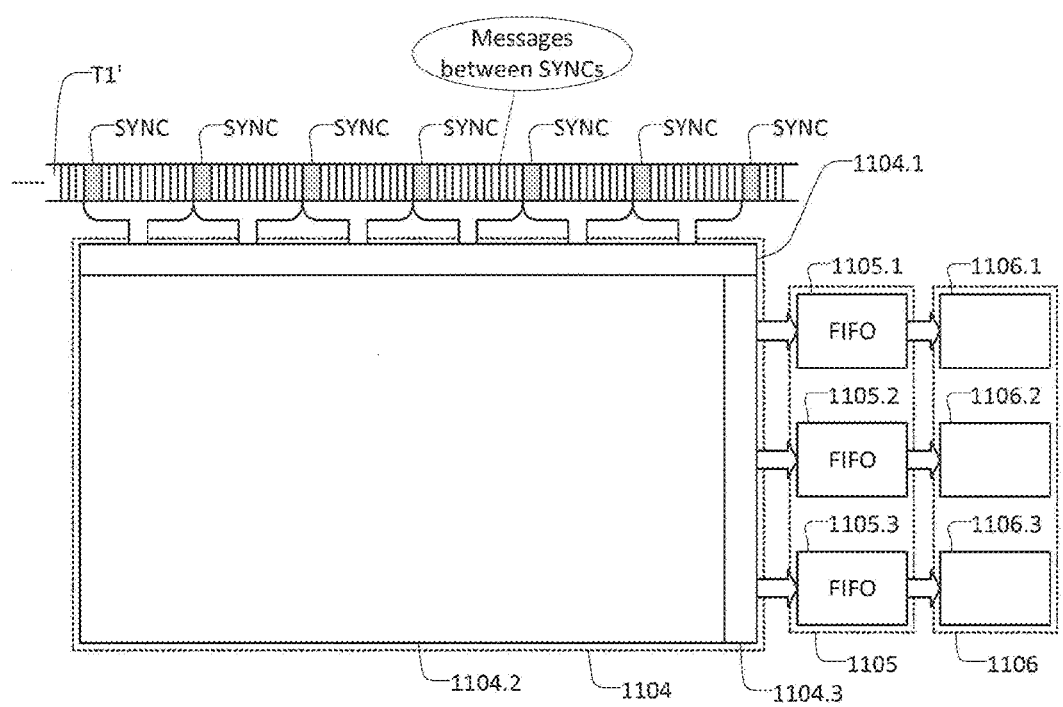
FIG. 16 is a schematic block diagram showing more detail of an implementation of the message-distribution stage.

With respect to FIG. 16, an embodiment implementing a message-distribution stage as indicated in FIG. 11 under reference label 1104 will be illustrated and explained. Thus, FIG. 16 is a schematic block diagram showing more detail of an implementation of the message-distribution stage 1104 of FIG. 11.

The message-distribution stage 1104 comprises an input interface 1104.1, a message distributor 1104.2, and an output interface 1104.3. The input interface 1104.1 provides input capacity for a section of the trace-message stream T1' received from the message pre-processing stage 1102. The input capacity allows receiving a section of the trace-message stream T1' at one moment in time, which comprises a plurality of synchronization messages SYNC, each SYNC message followed by a number of messages of other types. The message distributor 1104.2 is configured to separate the respective received section of the trace-message stream T1' and to divide it into a plurality of blocks, each block comprising at least one synchronization message SYNC and a number of messages of other types. For instance, each block may start with a SYNC message and comprise all messages followed by the SYNC message and arranged before the next occurrence of a SYNC message. This configuration of block is indicated for the embodiment of FIG. 16.

Furthermore, the message distributor is configured to forward the individual blocks to the output interface 1104.3, thereby allocating the respective individual sections of the trace-message stream to one of a plurality of external message-processing stages 1106.1 to 1106.3. Each of the individual parallel message processing stages 1106.1 to 1106.3 is allocated to a respective FIFO register 1105.1 to 1105.3 providing an intermediate storage capacity for buffering blocks of the trace-message stream T1' allocated to the respective message-processing stage by the message distributor 1104.2. The message distributor 1104.2 is configured to distribute the individual blocks to the respective message-processing stages according to the respective currently available capacities of the FIFO buffers 1105.1 to 1105.3. To this end, the memory capacity of the individual FIFO buffers 1105.1 to 1105.3 is monitored by the message distributor 1104.2. For instance, the incoming trace-message stream is separated into blocks, each of which is forwarded to a respective next FIFO buffer in the available plurality of FIFO buffers. The distribution process may be cyclic and thus assign a certain block to the first buffer after having assigned the respective previous block to the last buffer. In case one of the FIFO buffers has an overflow because the respective allocated message-processing stage has not finished a current processing, a suitable signal, such as an error signal, is provided to the message distributor 1104.2.

Instead of a certain cyclic allocation of incoming blocks to the different FIFO buffers, an alternative distribution strategy may be used. For instance, a distribution based only on the current availability of any FIFO buffer may be used. However, in this case, it is required to provide the assigned blocks with indicators that allow a reconstruction of the order of the blocks in the trace-message stream.

The message-distribution stage 1104 of the embodiment shown in FIG. 16 is based on the recognition that, for the reconstruction of a program execution flow, a time expenditure is required which is considerably higher than that required for the execution of the same instructions on the CPU of the DUT. However, it is desired for particular embodiments of the trace-data processing device to perform this reconstruction of the program execution flow in real time. In other words, for such embodiments, the determination of the reconstruction information in the trace-data processing device must be at least as fast as the execution of the program by the DUT. As a solution, the embodiments described hereinafter are based on a parallelized processing in performing the reconstruction of the program execution flow. To achieve a parallel processing in the reconstruction of the program execution flow, the incoming trace-message stream—if required by the specific DUT, in pre-processed form, as pre-processed in the message pre-processing unit 1102—is separated into different blocks. For determining the starting and end points of the blocks to be used in the separation of the trace-message stream, different implementations of a message-distribution unit use different messages in the trace-data stream as defining a block of messages to be processed by one of a number of parallel message-processing stages. The following synchronization messages are suitable for the definition of such blocks and thus form different examples of SYNC messages that may be employed to the end:
a) In an ARM ETM implementation, instruction flow synchronization messages (I-Sync messages) are suitable.
b) In a Nexus DUT, the following messages are suitable:
   Program trace synchronization message (TCODE 9);
   program trace-direct branch with Sync message (TCODE 11);
   program trace-indirect branch with Sync message (TCODE 12);
   program trace-indirect branch history with Sync message (TCODE 29);
   repeat instruction message with Sync message (TCODE 32).

These synchronization messages under a) and b) are periodically received from the respective DUT with predefined maximum time periods between two respective instances of transmission.

Message Processing Overview

Figure 17:
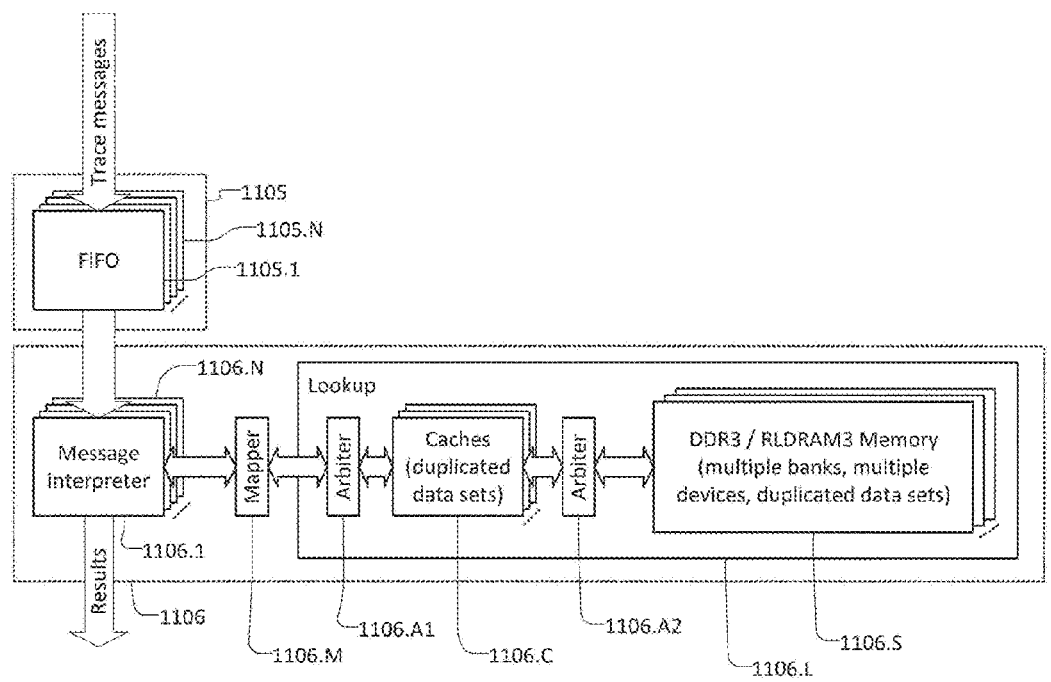
FIG. 17 is a schematic block diagram illustrating more detail of a structure of an embodiment of a message-processing unit 1106 shown in FIG. 11.

FIG. 17 is a schematic block diagram illustrating more detail of a structure of an embodiment of a message-processing unit 1106 shown in FIG. 11.

The message-processing unit is connected on its input side to the FIFO buffer unit 1105. The number of FIFO buffers corresponds to a number of message interpreters 1106.1 to 1106.N representing parallel instances of the message-processing stage. The message interpreters 1106.1 to 1106.N thus form the individual message-processing stages shown in FIG. 11 (there limited to only three stages). Each of the message interpreters accesses an infrastructure within the message-processing unit 1106 that comprises a lookup unit 1106.L and a mapper 1106.M connected between the message interpreters 1106.1 to 1106.N on one side and the lookup unit 1106.L on the other side. The lookup unit of the present embodiment comprises an arbiter 1106.A1, a cache unit 1106.C, a second arbiter 1106.A2, and a reconstruction memory unit 1106.S. The lookup unit 1106.L implements a high-performance lookup table that manages parallel accesses to the lookup table by different message interpreters. In order to achieve a particularly high performance, the reconstruction memory unit 1106.S comprises a memory made of multiple banks of memory, in particular DDR3/RLDRAM3 memory. As an alternative, multiple memory devices containing duplicated data sets for parallel access. Furthermore, the cache unit comprises a set of parallel cache memories, caching duplicated data sets in order to further accelerate the parallel access to the lookup table. The arbiters 1106.A1 and 1106.A2 serve for arbitration between different parallel accesses to the cache unit 1106.0 and to the reconstructions memory unit 1106.S by different message interpreters.

The mapper 1106.M is an optional component of the message-processing unit 1106. The function and advantages of the mapper 1106.M will be explained in the following with reference to FIG. 18.

Mapper

Figure 18:
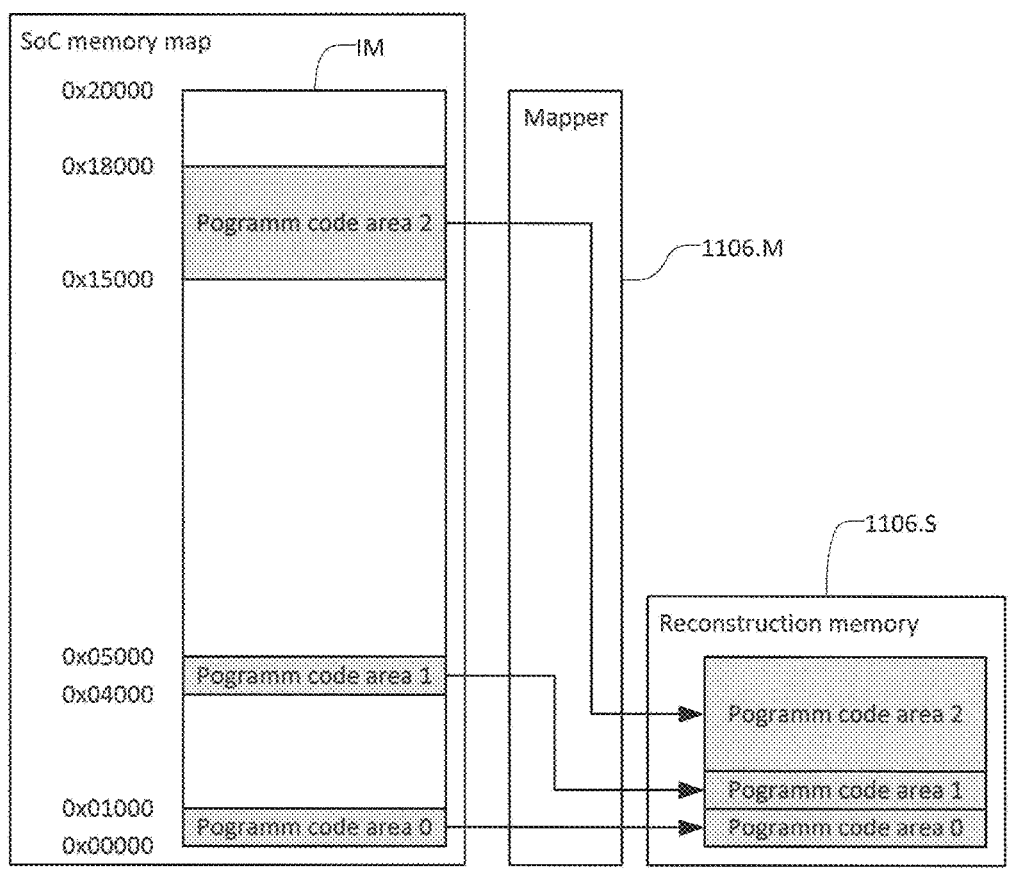
FIG. 18 is an illustration showing more detail of a mapper of the message-processing unit of FIG. 17.

FIG. 18 is an illustration of the functionality of the mapper 1106M of the message-processing unit 1106 of FIG. 17. The mapper receives from the message-interpreters 1106.1 to 1106.N access requests to the lookup table for providing information regarding instructions performed by the DUT and associated with instruction addresses of the instructions in an instruction memory IM. The instruction addresses are shown in the left column of the illustration as 0x00000 to 0x20000. Program code performed by the DUT is stored in address ranges between the instruction addresses 0x00000 and 0x00FFF ("program code area 0"), 0x04000 and 0x04FFF ("program code area 1") and 0x15000 to 0x17FFF ("program code area 2"). As can also be seen from FIG. 18, the program code areas do not cover a coherent range of the instruction memory. However, in the reconstruction memory unit 1106.S of the lookup unit 1106.L, the three lookup areas representing the three program code areas are stored in a coherent memory range. Accordingly, the addresses of individual instructions in the program code area the addresses of the lookup entries will differ between the DUT and the reconstruction memory unit 1106.S. In order to correctly interpret the access requests of the message interpreters 1106.1 to 1106.N, the mapper is configured to map the instruction addresses received from these message interpreters of the trace-data processing stages to the coherent memory-address range of the reconstruction memory unit 1106.S in the lookup unit 1106.L. This way, a coherent memory range can be used for storing a lookup entries representing program code performed by the DUT.

Lookup Table

In the following FIGS. 19 to 23, the lookup unit 1106.L will be discussed in more detail by way of different embodiments. The illustrations of FIGS. 19 to 23 provide on their left side an exemplary segment of program code stored in an instruction memory IM of the DUT. In all illustrations of FIGS. 19 to 23, an exemplary instruction-address range between the instruction addresses 0x80000 to 0x80054 is shown, as it is used in the DUT. To the right of this illustrative example of an instruction-address column stored in the DUT, instructions forming an opcode are represented and associated with the respective instruction address to the left. Thus, the left part of the illustrations of FIGS. 19 to 23 does not show data which is stored in the reconstruction memory unit 1106.S. On the right side of the illustrations, the content of a respective lookup table LUT1 (FIG. 19) to LUT5 (FIG. 23) stored in the reconstruction memory unit 1106.S of the respective embodiment of the trace-data processing unit 1106 is shown. Some embodiments of the lookup tables, namely, the lookup tables LUT1 of FIG. 19 and LUT2 of FIG. 20, comprise a copy of the instructions stored in the instruction memory of the DUT and shown on the left-hand side of the respective Figures. These exemplary instructions are stored in an exemplary lookup-address range between the addresses 0x00000 and 0x00054.

The trace-data stream provided by the DUT is typically provided in highly compressed form. Typically, the information provided in the trace-data stream is limited to the fact that a certain instruction was performed. However, for a reconstruction of a program execution flow in the evaluation of an instruction trace, it is a big challenge to reconstruct direct jumps. The target address of a jump is typically not provided together with the information that the corresponding instruction was performed. This is based on the recognition that for some branches it is not necessary for the DUT to provide the destination address. For direct branches, the assembler code provides an offset to be added to the current program counter (sometimes also referred to as PC).

Direct and indirect branches may be differentiated. Direct branches are defined in a code by an offset to be added to the current instruction address. All direct branches allow determining a target address solely from the executed instruction. For calculating a destination of a direct branch, the address and the information that a current instruction was executed is sufficient. The branch address must be output only when the program execution flow changes for a reason other than a direct branch. Such other reasons are known as indirect branches. Examples of indirect branches are:
  a load instruction,
  an instruction that moves a register into the program counter,
  an undefined instruction exception,
  all other exceptions, such as interrupt, abort, and processor reset.

Since for indirect branches the destination address is calculated at runtime, this information must be provided to the development system. The provision of this information is done in an optimized form according to preferred embodiments. In particular, not the full address is provided, but only an address offset.

All direct branches are branches whose target can be determined solely from the executed instruction. Therefore, to calculate the destination of the branch, it is necessary only to know the address of the instruction along with the fact that it executed.

Thus, one possibility of reconstructing the program-execution flow is based on making available a copy of the content or at least a part of the content of the program memory of the DUT. This is shown in the examples of the lookup tables LUT1 and LUT2 of FIGS. 19 and 20. By interpretation of the opcode in the message interpreters 1106.1 to 1106.n (n being any suitable integer larger than 2, such as for instance between 5 and 50, or n=3 in the exemplary embodiment of FIG. 16) it is determined whether a current instruction is a jump. If this is the case, the jump offset is ascertained.

In some DUTs, the data-trace only comprises a message indicating an address and a value of a data access. However, no information is provided whether the data access is a read or a write access. Therefore, in the variants formed by the lookup tables LUT3 to LUT5 of FIG. 21 to FIG. 23, information is provided is determined whether the current instruction is a read access or a write access. The missing information can therefore advantageously be ascertained during the processing of the trace data from the respective lookup table.

Furthermore, the lookup tables LUT1 to LUT5 comprise assignments of certain respective predefined instructions at certain lookup addresses to predefined event codes. However, this is not a requirement. It forms an advantageous option. Other embodiments of lookup tables (not shown) do not comprise this event code assignment. In the presently shown examples, for example, an I-Sync message at the lookup address 0x00010 of the lookup table LUT has an event label 101, and a branch instruction with an offset of (−8) at the lookup address 0x00022 has an assigned event code 202. The event codes form an identification of an event, to which an execution of the instruction at the given instruction address is allocated in accordance with a pre-stored list of events. This allows restriction of an evaluation of the addresses of instructions performed by the DUT to the certain predefined instructions, which are marked by respective event codes, instead of a complete address stream of instructions performed by the DUT. The output may optionally also include a time stamp. This use of predefined events also makes comparator logic or content-addressable memory unnecessary, both of which are required in prior-art solutions.

Figure 19:
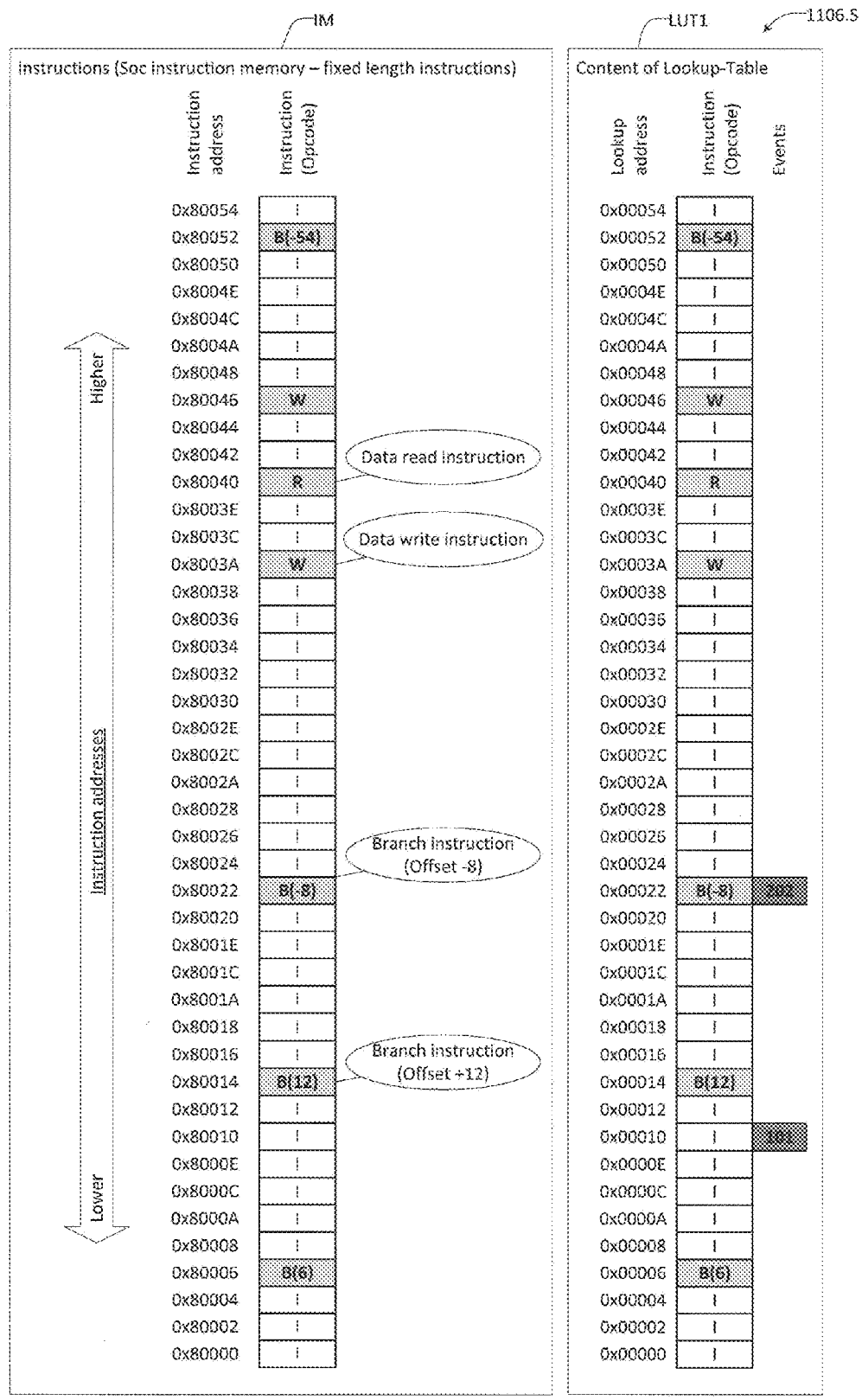
FIGS. 19 to 23 are different examples of lookup tables used in different embodiments of the trace-data processing device.
Figure 20:
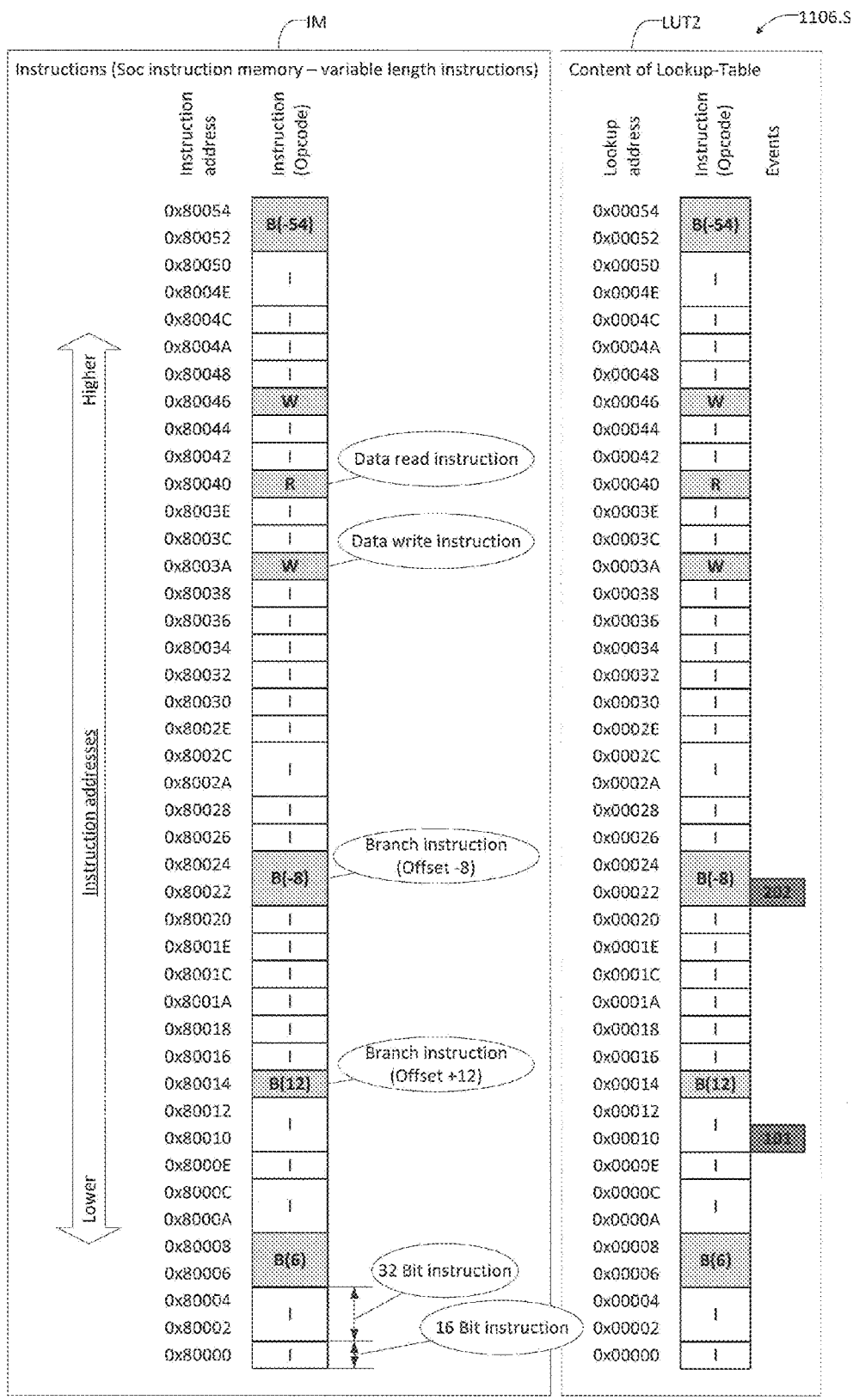
Figure 21:
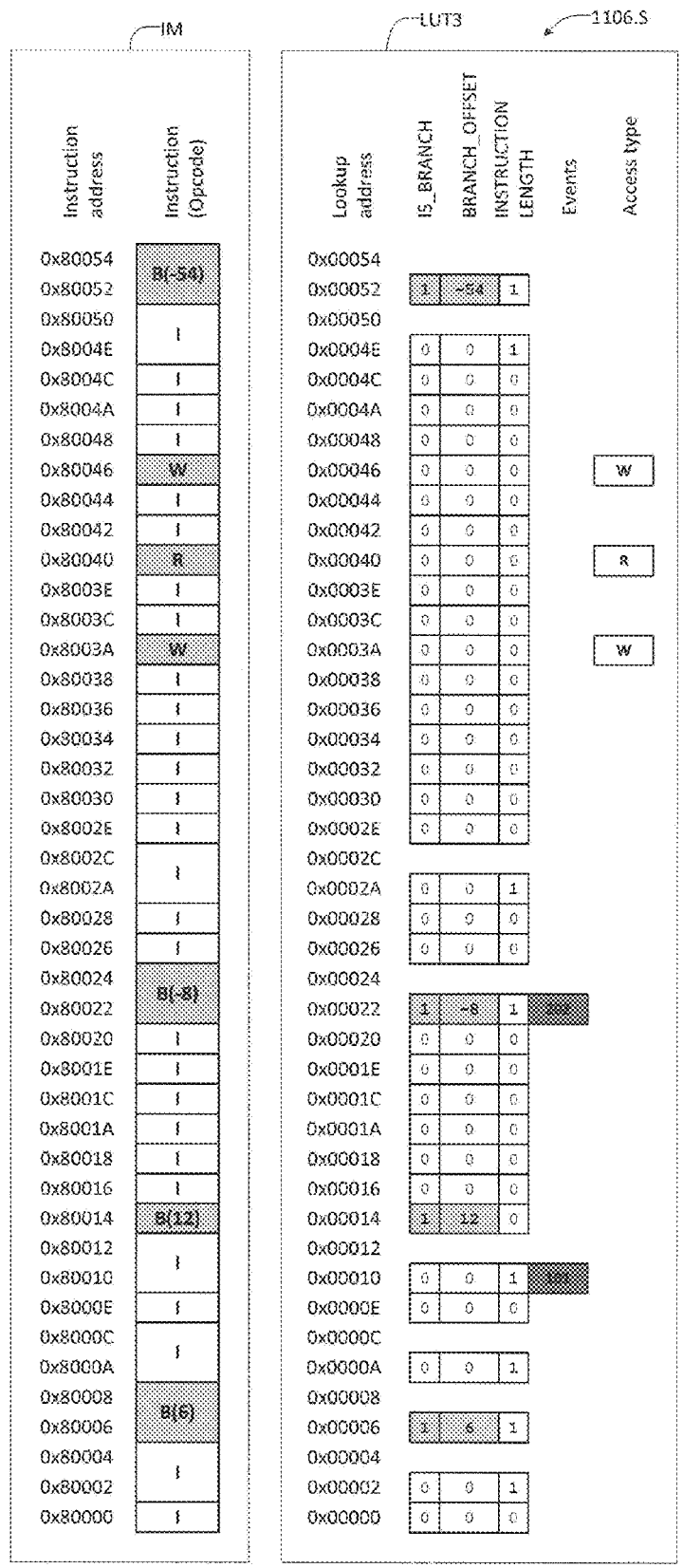
Figure 22:
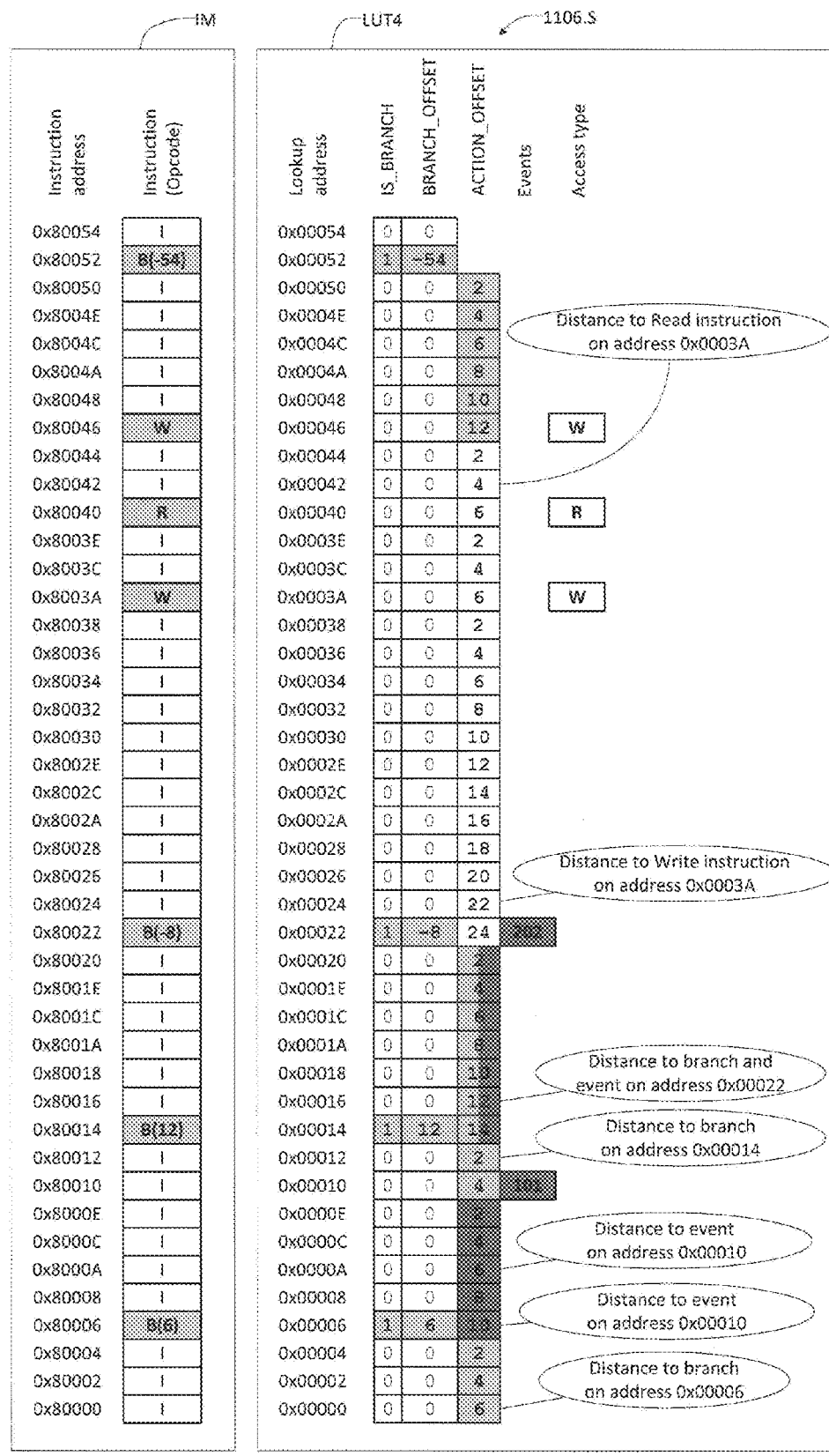
Figure 23:
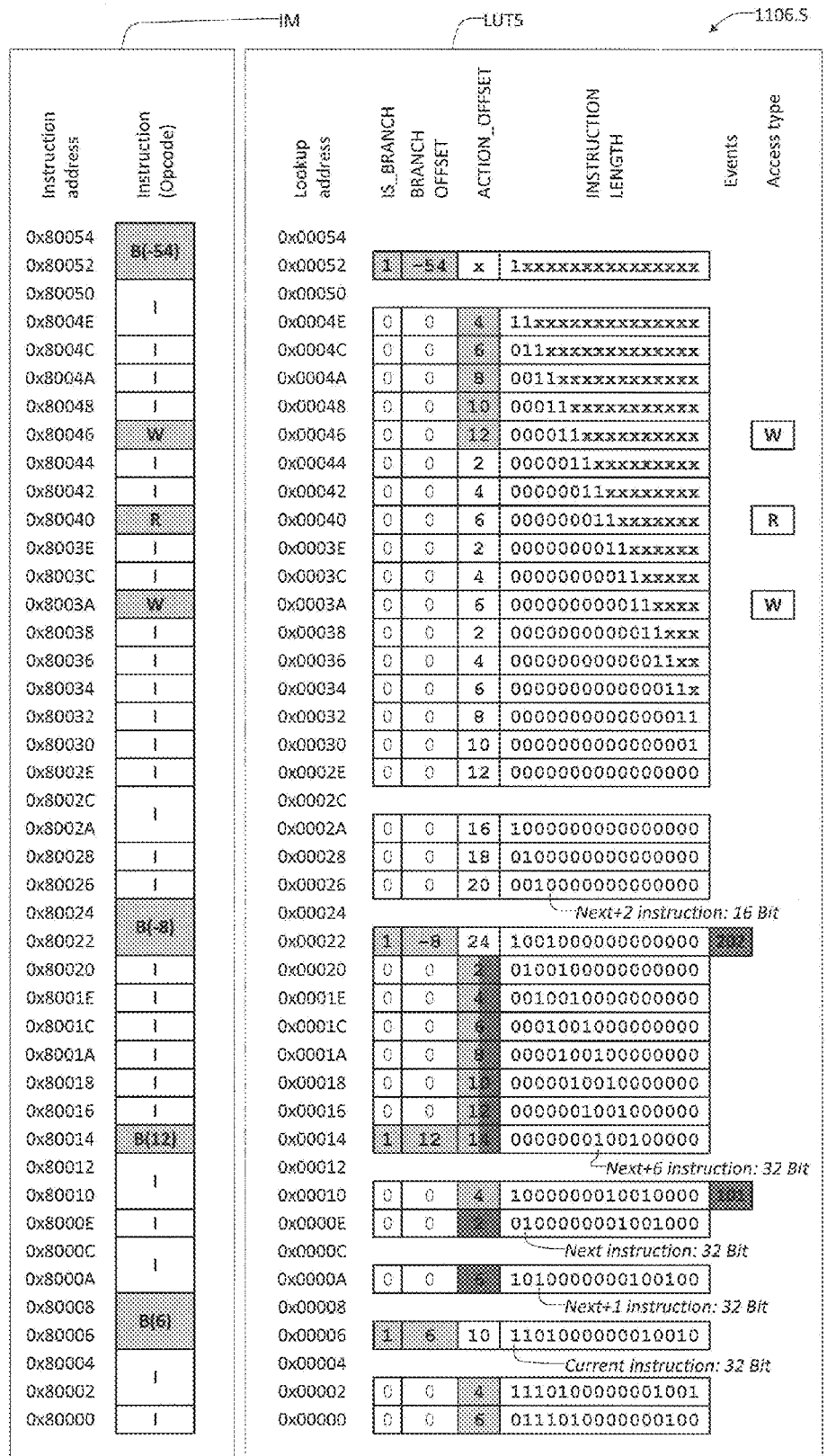

The opcode not only comprises the information required for reconstructing the program-execution flow, such as jump information or a length of an instruction and information required for identifying an access type to data, but also some other types of information, which may not be relevant for solving a given technical problem in the analysis of the trace-data received from the DUT. Therefore, embodiments of the lookup unit 1106.L reduce the information of the stored copy of the opcode in comparison with the original opcode stored in the instruction memory of the DUT in the lookup table. The lookup table stored in the lookup unit 1106.L is in different embodiments designed to store only some pieces of reduced information (in comparison with the full copy of the instruction), which is relevant for the given technical problem of the analysis of the trace-data. Depending on the particular application case, such information is:

An identification of the instruction as forming a jump instruction;
an offset associated with a jump instruction;
optionally: an identification of an instruction as a data access (read or write), cf. FIGS. 21 to 23; and
optionally, as mentioned: an identification of a predefined event, cf. FIGS. 19 to 22.

In some embodiments, different instructions of the instruction set used by the DUT have different instruction lengths, such as 16 and 32 bit. However, information about the respective instruction length is typically not comprised in the trace-data received from the DUT. Therefore, the trace-data processing in the message-processing stages 1106.1 to 1106.N of some embodiments accesses the lookup table for determining length information indicative of length of instructions. Length information is provided in the lookup table LUT3 of FIG. 21, and, in an enhanced form to be described in the following, in the lookup table LUT5 of FIG. 23. In the lookup table LUT5 of FIG. 23, the reconstruction information additionally includes an instruction-length preview concerning the instruction length of the next instructions following after the currently processed instruction. In the embodiments shown in FIG. 23, the length is encoded by two bit values 0 and 1, representing instruction lengths of 16 and 32 bit. The left-most bit in the shown sequence of 16 instruction-length bits indicates the length of the current instruction. The bit following to the right indicates the length of the instruction that follows in the instruction memory, followed by coded information on the length of the instructions up to the $15^{th}$ instruction following the current instruction. The number of following instructions covered by the instruction length preview can be varied in different embodiments. It thus may take a smaller or larger value, depending on the embodiment.

In case of variable instruction length, a meaningful disassembling can only be achieved at valid instruction addresses. Therefore, the step width of the disassembling results from the shortest possible instruction length. In case the start of the disassembling of an instruction is at an invalid start address, i.e. in the middle of a longer instruction, the entry at this point in the lookup table may be an invalid information. However, that is not relevant because, in a regular program execution flow, this invalid instruction address will never be jumped to.

Thus, trace-messages carrying the execution-flow information in compressed form are decompressed, using the pre-stored reconstruction information in the lookup table, which comprises a representation of at least a fraction of a copy of the memory content of the instruction memory of the DUT. The memory content represents pre-stored reconstruction information and may be provided in the form of a full program code, such as shown in FIGS. 19 and 20. In other embodiments, such as those of FIGS. 21 to 23, the information stored in the lookup table is advantageously reduced and forms only extracts of information from the program code. Such extracted information includes at least a) branch-instruction information (cf. FIGS. 21 to 23), which is indicative of that an instruction at a respective current instruction address is a branch instruction, which is any instruction that controls the flow of program execution to proceed with an instruction other than a respective next instruction in the executable program code. In the examples of FIGS. 21 to 23, the branch information is shown as a bit value of a parameter "IS_BRANCH" stored for each instruction, without the actual instruction being stored in the lookup table LUT3, LUT4, and LUT5, respectively. The bit value 1 indicates that an instruction at a given instruction address is a branch instruction. In the exemplary case of the lookup table LUT3 of FIG. 21, instructions at the instruction addresses 0x00006, 0x00014, 0x00022, and 0x00052 are identified as branch instructions in the lookup table.

b) for a branch instruction at a respective current instruction address: branch-offset information indicative of at least one of the following:

aa) In one alternative: An address offset between the respective current instruction address and an instruction to be jumped to from the respective current instruction address in the program execution flow. In the lookup table LUT3 of FIG. 21, the address offset is shown in the column "BRANCH_OFFSET". For instance, the branch instruction at the lookup address 0x00006 has a branch offset of 6 in terms of instruction address values.

bb) In a second alternative: An instruction offset between the respective current instruction and an instruction to be jumped to from the respective current instruction in the program execution flow.

c) Optionally: Data-access information regarding the instruction at the current instruction address and indicative of only one of a read-type and a write-type, with respect to a data access to be executed by the DUT to a data memory of the DUT. The data access information is shown in the lookup tables LUT3, LUT4, and LUT5 of FIGS. 21 to 23 in the right column labeled "access type". In the present exemplary lookup tables of FIGS. 21 to 23, an instruction at the lookup address 0x0003A and an instruction at a lookup address 0x00046 are identified as write access. An instruction at the lookup address 0x00040 is identified as a read access.

As mentioned, in some cases, the DUT uses an instruction set with variable length. In this case, the lookup table additionally includes length information indicative of a length of those instructions between the current instruction and the next instruction. In the lookup table LUT3 of FIG. 21, the instruction length is shown for the respective lookup addresses in the column "INSTRUCTION LENGTH". Two different instruction lengths (e.g. 16 Byte, 32 Byte) are represented and distinguished by two bit values 0 and 1. The message-processing stage processing trace data regarding a given instruction is configured to decode the length information and to refrain from accessing the reconstruction memory for determining instruction lengths of those instructions covered by the length information.

In the embodiments of FIGS. 22 and 23, the reconstruction information stored in the respective lookup tables LUT4 and LUT5 additionally comprises action-offset information associated with each instruction address. The action-offset information is shown in the column labeled "ACTION., OFFSET". The action-offset information is indicative of an instruction address offset between the current instruction address and an instruction address of the next branch instruction, of a next data-access instruction or of a next event, in accordance with the event information, in the program-execution flow. In an alternative (not shown), the action-offset information represents an instruction offset corresponding to the number of instructions between the current instruction and a next branch instruction, a next data-access instruction or a next event in the program-execution flow. In these embodiments, the message-processing stage is configured to determine from the action-offset information that is associated with a currently process instruction, an instruction address of an instruction to be processed next by the message processing stage.

The lookup tables of FIGS. 19 and 20 require a read access to the memory of the lookup unit for every instruction performed by the DUT. While caching and speculative read strategies may somewhat accelerate these read accesses, the processing speed of the trace-data processing may be too low for some application cases.

In order to further accelerate the trace-data processing, the lookup tables LUT4 and LUT5l of FIGS. 22 and 23 include action-offset information. Action offset means the number of instructions before an event defined as a relevant action occurs. Relevant actions may, for instance, be predefined events, jump instructions, data accesses or other. The values to be added to the lookup table for defining the action offset are in the examples of FIGS. 22 and 23 defined by address offset to the address at which one or more relevant actions occur. This feature allows avoiding reading those lookup entries, which do not form a relevant action. This substantially accelerates the evaluation. With the use of the instruction-length preview as in the lookup table LUT5 of FIG. 23, the number of accesses to the lookup table is further reduced in comparison with the previous embodiments of lookup tables. This principle can be extended (not shown) by additional storing of the action type (event, branch and/or data access), the corresponding information (branch offset, event number, access type) and the following branch offset. In case of the lookup address 0x0000A the actual action offset (shown, 6) and additionally (not shown) the type of action at the action address 0x00010, which is an event, the event ID (101) and the next action offset (4) will be stored. This information will obviate the lookup read access at address 0x00010.

In a situation where the length of the action-offset information field is not sufficient for the value that would have to be provided in this field, an arbitrarily defined value, suitably the maximum possible value, is entered in the action-offset field, resulting in an intermediate jump to a lookup entry that provides the remaining jump to the actual relevant action or to another intermediate address. Thus, the providing of the action-offset field allows an immediate determination for every jump-in at an arbitrary instruction where the next relevant action is to be found.

In case of variable instruction lengths, the determination of the address to be jumped to from the action-offset fields implies using the additional information provided in the instruction-length-preview fields.

Reconstruction of Program Execution Flow

In the following, the reconstruction of a program-execution flow will be explained, using an example of an ARM ETM trace data stream. The instruction sequence, the allocated trace messages and the information generated in the trace-data processing device are shown in Table 1. Table 1 references to FIG. 23, i.e., are based on using the lookup table LUT5 of FIG. 23.

TABLE 1

| ID | Executed Instruction (Address) | ETM Trace-Message | Runtime Information Generated |
|---|---|---|---|
| 0 | 0x80000 | ISYNC (0x80000) P-Header (1xN, 4xE) (four instructions executed and one instruction not executed) | JUMP_IN (0x80000) (initial) |
| 1 | 0x80002 | | |
| 2 | 0x80006 | | JUMP_OUT (0x80006) |
| 3 | 0x80010 | | JUMP_IN (0x80010), EVENT (101) |
| 4 | | | NOT_EXECUTED (0x80014) |
| 6 | 0x80016 | P-Header (1xN, 15xE) | |
| 7 | 0x80018 | | |
| 8 | 0x8001A | | |
| 9 | 0x8001C | | |
| 10 | 0x8001E | | |
| 11 | 0x80020 | | |
| 12 | 0x80022 | | JUMP_OUT (0x80022), EVENT (202) |
| 13 | 0x8001A | | JUMP_IN (0x8001A) |
| 14 | 0x8001C | | |
| 15 | 0x8001E | | |
| 16 | 0x80020 | | |
| 17 | 0x80022 | | JUMP_OUT (0x80022), EVENT(202) |
| 18 | 0x8001C | | JUMP_IN (0x8001A) |
| 19 | 0x8001E | | |
| 20 | 0x80020 | | |
| 21 | 0x80022 | | JUMP_OUT (0x80022), EVENT(202) |
| 22 | 0x80026 | P-Header (0xN, 4xE) | JUMP-IN (0x8001A) |
| 23 | 0x80028 | | |
| 24 | 0x8002A | | |
| 25 | 0x8002E | | |

In order to generate the desired runtime information, the following accesses to the lookup table have to be performed, cf. Table 2.

TABLE 2

| Lookup Address | Processed P-Header | Next Lookup Address |
|---|---|---|
| 0x80000 | ID 1: P-Header (NEEE) | current address + 6 = 0x80006 |
| 0x80006 | ID 1: P-Header (NEEE) | current address + 10 = 0x80010 |
| 0x80010 | ID 6: P-Header (EEEEEEEEEEEEEE) | current address + 18 = 0x80022 |
| 0x80022 |  | current address − 8 = 0x8001A |
| 0x8001A | ID 6: P-Header (EEEEEEEEEEEEEE) | current address + 8 = 0x80022 |
| 0x80022 |  | current address − 8 = 0x8001A |
| 0x8001A | ID 6: P-Header (EEEEEEEEEEEEEE) | current address + 8 = 0x80022 |
| 0x80022 | ID 21: P-Header (NE) | current address + 4 = 0x80026 |
| 0x80026 | ID 22: P-Header (EEEE) |  |

The example of Table 2 shows that the trace-data processing for 26 instructions requires a total of 8 accesses to the lookup table. In the lookup table of FIG. 21, 26 accesses would be required, i.e., one access per instruction.

The processing speed of an individual message interpreter depends on the access speed to the lookup table. Since large amounts of data are required for the lookup table in many application cases, a FPGA implementation of the trace-data processing device will often not allow storing the lookup table in local memory. Instead, external memory components have to be used. Memory components with large capacity, such as DDR3 SDRAM, and providing a high random transaction rate (RTR), such as RLDRAM3, are particularly advantageous. The access to the lookup table is preferably accelerated by a cache unit, as shown in FIG. 17 under reference label 1106C. The bottleneck of SDRAM memory devices is the time-consuming change of the rows. By an interlaced access to random data, which is replicated across banks within the memory, the waiting times required for reading can be used by other instances of the message interpreter.

A further increase of processing speed is achieved by providing a memory unit 1106.M that allows several message interpreters to access different instances of the cache memory 1106.C. In case cache content has to be loaded, a further arbitration logic 1106.A2 selects one of those memory components or a memory bank within the memory components, which is currently available. This is based on redundantly storing the lookup table in the several parallel memory components or in memory components with several memory banks. Since the lookup table is limited in size, it is typically not possible to provide an entry in the lookup table for all instructions of the complete address range used by the DUT. Therefore, some embodiments use a mapping of the entries of the lookup table, similar to the functionality of a memory management unit (MMU). In case the lookup table does not comprise the full address range used, a jump into the used address range may be accompanied by generating a JUMP_IN, and leaving an address range used may be accompanied by providing a JUMP_OUT. DUTs may dynamically change between different instruction sets. For the exemplary case of ARM ETM, a change between ARM, Thumb, ThumbEE and Jazelle may be performed dynamically. Such a change in the instruction set is typically indicated by the DUT by a corresponding trace message. Such a trace message will trigger a switch between different lookup tables stored in the lookup unit 1106.L. As this example shows, the number of lookup tables implemented in a single trace-data processing device may vary, depending on the number of instruction sets used in the executed program and in the address range under consideration.

Additionally, the message interpreters may be functional for generating the following additional output information on the program execution flow:
- Internally generated time stamps;
- environmental parameters, such as measured voltages of analog inputs, supply voltage, current input, temperature;
- event channels.

Using the reconstruction information stored in the different embodiments shown, the message-processing stages 1106.1 to 1106.N are configured to generate and provide at their output the runtime information evaluated and comprising one or more of the following information:
- jump-out information indicative of an instruction address of an instruction that executed a jump out;
- jump-in information indicative of an instruction address of an executed instruction subject to a jump in;
- not-executed information indicative of an instruction address of a non-executed instruction;
- event information indicative of an instruction address of a predefined event executed in the program execution flow;
- waypoint information indicative of an instruction address of a waypoint in the program execution flow;
- clock-cycle information indicative of a number of processor clock cycles of the DUT between two executed events;
- a current context identifier of an instruction executed;
- a current instruction set to which an instruction executed belongs;
- any exception detected in executing a given instruction;
- timestamps associated with instructions; and
- a data trace comprising a value, a memory address and an access type, read or write, associated with a memory access.

Program Execution Reconstruction Flow Diagrams

FIGS. 24 to 29 are flow diagrams of different embodiments of decompression algorithms performed by embodiments of the trace-data processing device of the present invention. The flow diagrams use a labeling, in which processes are marked as P, and decisions are marked as D. To distinguish different processes and decisions from respective other processes and decisions, a numbering is used, which refers to detailed descriptions given in the following.

Figure 24:
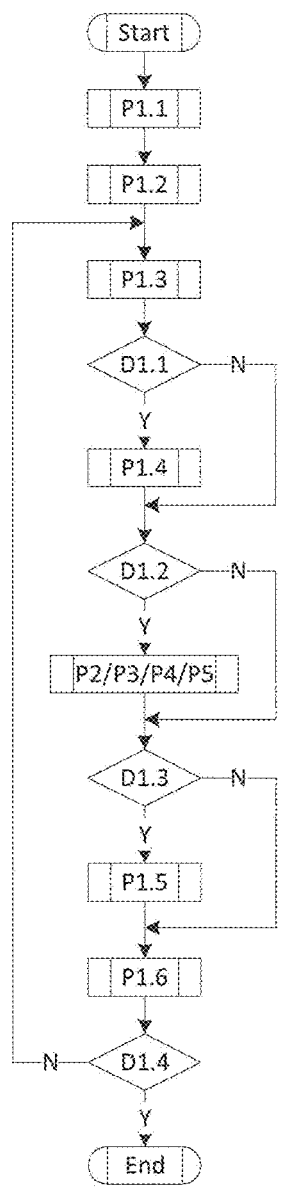
FIGS. 24 to 29 are flow diagrams of different embodiments of decompression algorithms and methods for computing runtime information from trace data performed by embodiments of the trace-data processing device of the present invention based on the different examples of lookup tables shown in FIGS. 19 to 24.

For the message processing sequence of FIG. 24, the following sequence of processes and decisions is performed:

TABLE 3

| Step | Operation Performed |
|---|---|
| P1.1 | Wait for I-Sync message |
| P1.2 | Compute I-Sync<br>Evaluate corresponding absolute instruction address from I-Sync (CURRENT_DUT_ADDRESS, hereinafter CDA)<br>set CURRENT_ACTION_OFFSET (hereinafter CAO, see P3 and P5) = 0 |
| P1.3 | Wait for next message |
| D1.1 | Evaluate message type "indirect branch message"<br>message contains indirect branch information: Y<br>message does not contain indirect branch information: N |
| P1.4 | Compute indirect branch<br>compute new CDA (current CDA + indirect branch offset)<br>output side channel information indicating a "Jump out" and the jump source address<br>output side channel information indicating a "Jump in" and the jump destination address<br>set CAO = 0 |
| D1.2 | Evaluate message type "instruction or direct branch execution message" (P-header) |

TABLE 3-continued

| Step | Operation Performed |
|---|---|
| | message contains instruction or direct branch execution information: Y |
| | message does not contain instruction or direct branch execution: N |
| P2/P3/ P4/P5 | Execute message processing depending DUT architecture and lookup table variant |
| D1.3 | Evaluate message type I-Sync |
| | message contains instruction synchronization information: Y |
| | message does not contain instruction synchronization information: N |
| P1.5 | Check for error in instruction reconstruction |
| | CDA != absolute instruction address?: Y |
| | CDA = absolute instruction address?: N |
| P1.5 | Handle instruction reconstruction error |
| P1.6 | Compute other message information, for example |
| | output EVENT in case of a watchpoint message |
| | output EVENT in case of an ownership change message |
| D1.4 | Evaluate, if all runtime information of the current segment of trace-data are computed |
| | (this can be signalized by receiving a second I-Synch message or by a control signal from the message distribution stage) |
| | computation of current trace-data segment finished: Y |
| | computation of current trace-data segment not finished: N |

FIGS. 25 to 28 show different implementations of methods for computing runtime information from trace-data. Generally, there are two implementations of encoding the program execution in the trace-data. Trace-data of implementation type "instruction level" provides information whether an instruction is executed or not. The "instruction level" trace-data stream contains messages which indicate the execution or non-execution of single instructions, hereinafter denoted as P-Message. In an ARM CoreSight ETM, such messages are provided in P-headers. A P-Message comprises two elements:
a) The number of executed instructions (EXECUTED_INSTRUCTION_COUNT, hereinafter EIC); and b) the number of non-executed instructions (NOT_EXECUTED_INSTRUCTION_COUNT, hereinafter NEIC) following the previously executed instructions.

Figure 25:
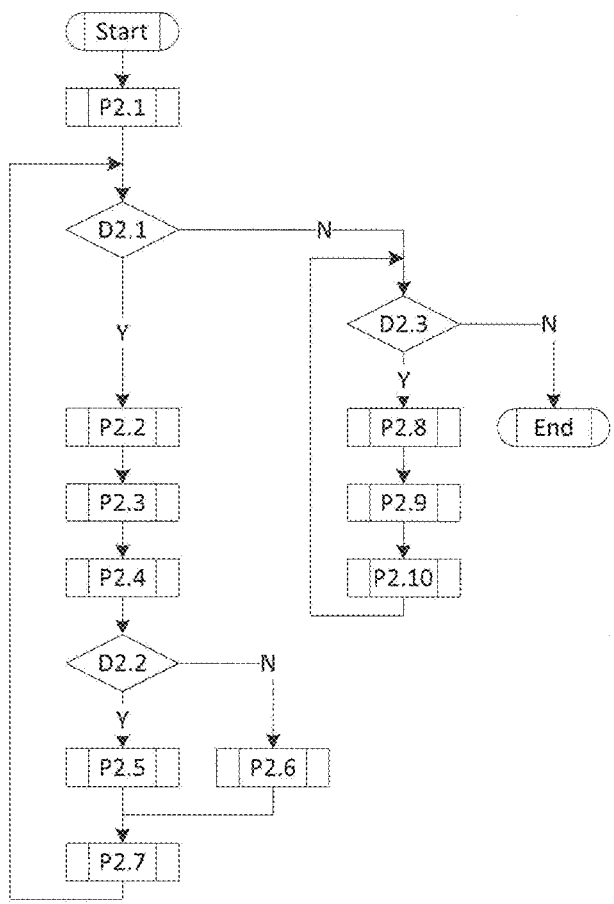
Figure 26:
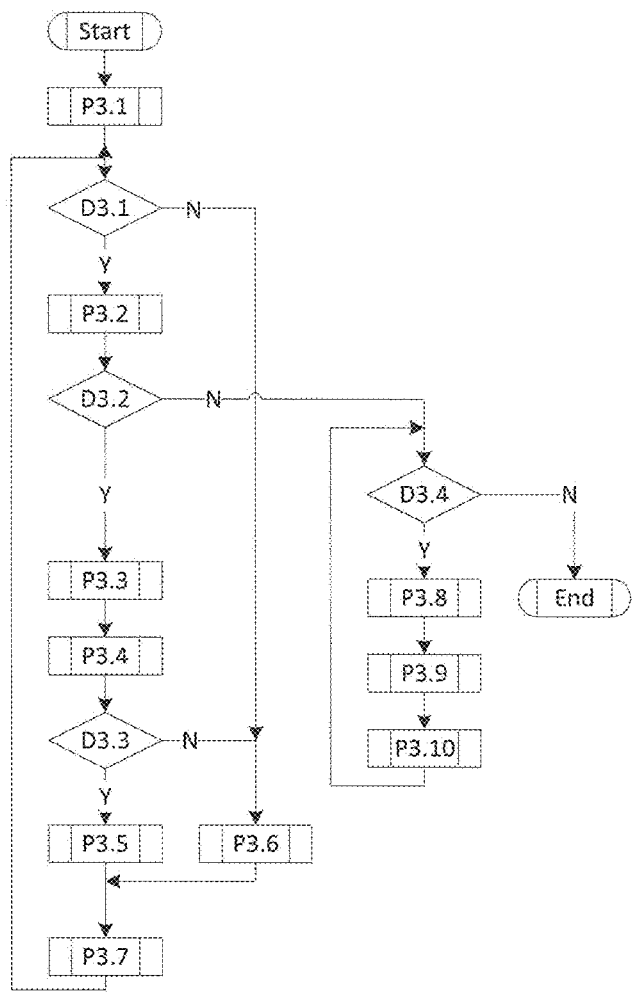

A description of processing instruction-level trace-data is given in the exemplary processes of FIGS. 25 and 26. FIG. 25 is an example of an instruction-level processing without using action offsets. This implementation corresponds to using lookup tables according to the embodiments shown in FIGS. 19 to 21. Thus, the instruction reconstruction information contains either a copy of the program code, such as shown in the embodiments of FIGS. 19 and 20, or equivalent information, like IS_BRANCH, DATA_ACCESS, BRANCH_OFFSET and (optionally) INSTRUCTION_LENGTH, such as shown in the example of a lookup table of FIG. 21. Referring to the processing flow of FIG. 25, the following steps are performed for computing a P-Message:

TABLE 4

| Step | Operation performed |
|---|---|
| P2.1 | Wait for a P-Message and read the number of executed and not executed instructions |
| | set EIC |
| | set NEIC |
| D2.1 | Evaluate, if there are executed instructions |
| | (EIC > 0): Y |
| | (EIC == 0): N |
| P2.2 | Compute CURRENT_RECONSTRUCTION_ADDRESS (hereinafter CRA) (mapped CDA, without mapper (claim 4): CRA = CDA) and read reconstruction information from the CRA and determine the instruction type and instruction length |

TABLE 4-continued

| Step | Operation performed |
|---|---|
| P2.3 | If the reconstruction information contains an event (EVENT_ID [DRA!=0), output side channel information indicating an event (Event ID, CDA) |
| P2.4 | If the instruction is a data access, output side channel information indicating data access |
| D2.2 | Evaluate, if the instruction is a branch |
| | Is a branch: Y |
| | Is not a branch: N |
| P2.5 | Compute Branch |
| | Determine the branch offset and add this value to CDA |
| | Output side channel information indicating a "Jump out" and the jump source address |
| | Output side channel information indicating a "Jump in" and the jump destination address |
| P2.6 | Update CDA |
| | Determine instruction length of the current instruction and add this value to CDA |
| P2.7 | Decrement EIC |
| | EIC = EIC−1 |
| D2.3 | Evaluate, if there are not executed instructions |
| | (NEIC > 0): Y |
| | (NEIC == 0): N |
| P2.8 | Compute CRA (mapped CDA) and read re-construction information from the CRA and determine the instruction length |
| P2.9 | Output side channel information indicating a "Not executed" and CDA |
| P2.10 | Decrement NEIC |
| | NEIC = NEIC−1 |

For each instruction, the reconstruction information has to be read, as performed in the steps P2.2 and P2.8.

FIG. 26 shows a further processing algorithm for a case, in which the instruction reconstruction information contains action-offset information, as given in the column labeled ACTION_OFFSET in the lookup tables of the algorithm shown in FIG. 26, will compute a P-Message as follows. A global variable CAO (CURRENT_ACTION_OFFSET) indicates an address offset to a respective next action. In an alternative variant, this global variable to indicates a number of instructions to be performed before the next predefined action. A local variable ILPP (INSTRUCTION_LENGTH_PREVIE_POINTER) forms a pointer to the actual position of the instruction length vector INSTRUCTION_LENGTH_PREVIEW, as shown in FIG. 23. The process is performed as shown in the following table:

TABLE 5

| Step | Operation performed |
|---|---|
| | Wait for a P-Message and read the number of executed and not executed instructions-set EIC |
| | set NEIC |
| D3.1 | Check, if there is an Action |
| | CAO == 0: Y |
| | CAO > 0: N |
| P3.1 | Compute CRA (mapped CDA) and read reconstruction information from the CRA |
| | CAO = ACTION_OFFSET [CRA] |
| | update IS_BRANCH |
| | update IS_READ |
| | update BRANCH_OFFSET |
| | update EVENT_ID |
| | update INSTRUCTION_LENGTH_PREVIEW |
| D3.2 | Evaluate, if there are executed instructions |
| | (EIC > 0): Y |
| | (EIC == 0): N |
| P3.3 | If the reconstruction information contains an event (EVENT_ID != 0 ), output side channel information indicating an event (EVENT_ID, CDA) |

TABLE 5-continued

| Step | Operation performed |
|---|---|
| P3.4 | If the instruction is a data access (IS_READ), output side channel information indicating data access |
| D3.3 | Evaluate, if the instruction is a direct branch<br>Is a direct branch: Y<br>Is not a direct branch: N |
| P3.5 | Compute direct branch<br>Determine the branch offset and add this value to CDA<br>Output side channel information indicating a "Jump out" and the jump source address<br>Output side channel information indicating a "Jump in" and the jump destination address |
| P3.6 | Update CDA-Determine instruction length of the current instruction (INSTRUCTION_LENGTH_PREVIEW[ILPP]) and add this value to CDA |
| P3.7 | Update EIC and CAO<br>EIC = EIC−1<br>CAO = CAO − (INSTRUCTION_LENGTH_PREVIEW [ILPP]) |
| D3.4 | Evaluate, if there are not executed instructions<br>(NEIC > 0): Y<br>(NEIC == 0): N |
| P3.8 | Update CDA<br>Determine instruction length of the current instruction (INSTRUCTION_LENGTH_PREVIEW[ILPP]) and add this value to CDA |
| P3.9 | Output side channel information indicating a "Not executed" and CDA |
| P3.10 | Decrement NEIC − NEIC = NEIC−1 |

An advantage of the processing performed according to the algorithm of FIG. 26 is that reconstruction information has to be read (in step P3.2) only for those instructions, which are marked as "action" according to the lookup table shown in FIG. 26.

Trace data of implementation type "waypoint level" provides information whether a waypoint instruction is executed or not. A waypoint instruction is a point where instruction execution by the CPU might involve a change in the program flow and that can be statically determined from the program image. Examples for the type of "waypoint level" implementations are Nexus or ARM CoreSight PFT for Cortex A series CPUs.

The "waypoint level" trace data stream contains messages which indicate the execution or non-execution of a branch instruction (hereinafter "atom message", e.g. ARM CoreSight ETM: Atom packet; Nexus: Branch history message). The atom message consists of consecutive bits, which indicate if a branch is executed or not.

Figure 27:
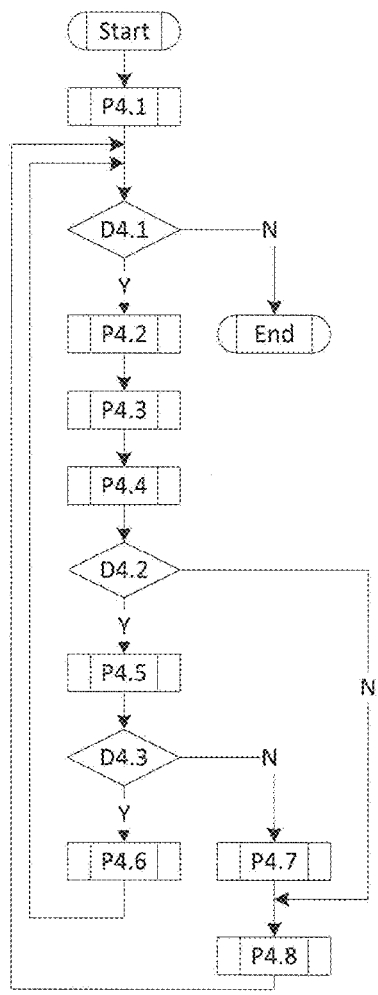

The flow diagram of FIG. 27 shows an algorithm for processing an atom message, in accordance with embodiments using a lookup table as shown in FIGS. 19 to 21. As discussed before, those lookup tables do not contain information on an action offset. The process shown in FIG. 27 computes an atom message as follows:

TABLE 6

| Step | Operation performed |
|---|---|
| P4.1 | Wait for an atom message and read the consecutive bits, which indicate if a branch is executed or not (hereinafter AT) and determine the number of ATOMs (hereinafter NAT) |
| D4.1 | Evaluate, if there are AT bits to be computed<br>(NAT > 0): Y<br>(NAT == 0): N |
| P4.2 | Compute CRA (mapped CDA) and read reconstruction information from the CDA and determine the instruction type and instruction length |
| P4.3 | If the reconstruction information contains an event (EVENT_ID [CRA]!=0), output side channel information indicating an event (Event ID, CDA) |
| P4.4 | If the instruction is a data access, output side channel information indicating data access |
| D4.2 | Evaluate, if the instruction is a direct branch<br>Is a branch: Y<br>Is not a branch: N |
| P4.5 | Decrement NAT<br>NAT = NAT −1 |
| D4.3 | Evaluate, if the branch is executed (corresponding AT bit)<br>Is executed: Y<br>Is not executed: N |
| P4.6 | Compute Branch<br>Determine the branch offset and add this value to CDA<br>Output side channel information indicating a "Jump out" and the jump source address<br>Output side channel information indicating a "Jump in" and the jump destination address |
| P4.7 | Output "Not executed"<br>Output side channel information indicating a "Not executed" and CDA |
| P4.8 | Update CDA<br>Determine instruction length of the current instruction and add this value to CDA |

A disadvantage of the method of FIG. 27 is that for each instruction corresponding reconstruction has to be read in the step P4.2.

Figure 28:
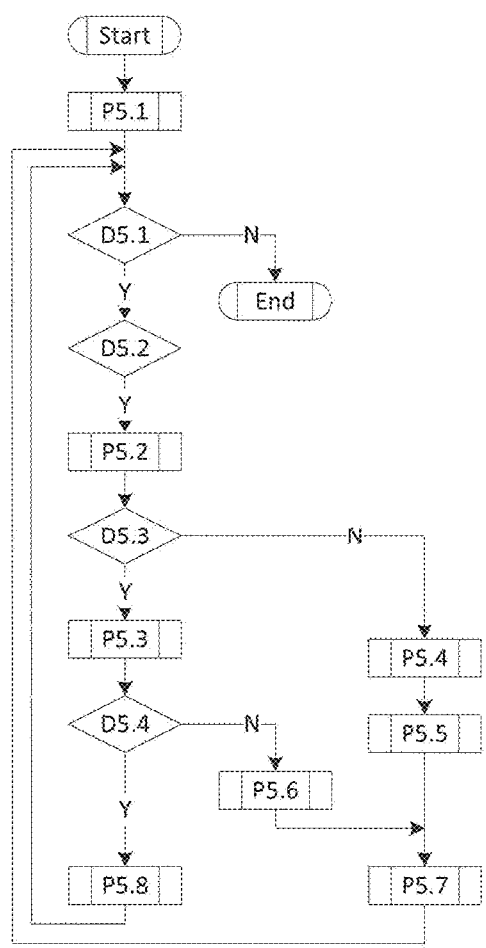

To further improve this method, an embodiment of a trace-data processing device implements an algorithm as shown in FIG. 28. The algorithm of FIG. 28 is applicable in embodiments, which use action-offset information in the lookup table. Thus, reference can for instance be made to the embodiments of FIGS. 22 and 23. The process of FIG. 28 for computing an atom message is as follows:

TABLE 7

| Step | Operation performed |
|---|---|
| P5.1 | Wait for an atom message and read the consecutive bits AT and determine NAT |
| D5.1 | Evaluate, if there are AT bits to be computed<br>(NAT > 0): Y<br>(NAT == 0): N |
| D5.2 | Check, if there is an Action<br>CAO == 0: Y<br>CAO > 0: N |
| P5.2 | Compute CRA (mapped CDA) and read reconstruction information from the CRA<br>CAO = ACTION_OFFSET[CRA]<br>update IS_BRANCH<br>update IS_READ<br>update BRANCH_OFFSET |

TABLE 7-continued

| Step | Operation performed |
|---|---|
| | update EVENT_ID |
| | update INSTRUCTION_LENGTH_PREVIEW |
| D5.3 | Evaluate, if the instruction is a branch |
| | Is a branch: Y |
| | Is not a branch: N |
| P5.3 | Decrement NAT |
| | NAT = NAT −1 |
| D5.4 | Evaluate, if the branch is executed (corresponding AT bit) |
| | Is executed: Y |
| | Is not executed: N |
| P5.4 | If the reconstruction information contains an event (EVENT_ID [CDA]!=0), output side channel information indicating an event (Event ID, CDA) |
| P5.5 | If the instruction is a data access, output side channel information indicating data access |
| P5.6 | Output side channel information indicating a "Not executed" and CDA |
| P5.7 | Update CDA |
| | Determine instruction length of the current instruction (INSTRUCTION_LENGTH_PREVIEW[ILPP]) and add this value to CDA |
| P5.8 | Compute Branch |
| | Determine the branch offset and add this value to CDA |
| | Output side channel information indicating a "Jump out" and the jump source address |
| | Output side channel |

The advantage of the process of FIG. 28 is that, only for those instructions marked as "action", the reconstruction information has to be read in step P5.2.

Figure 29:
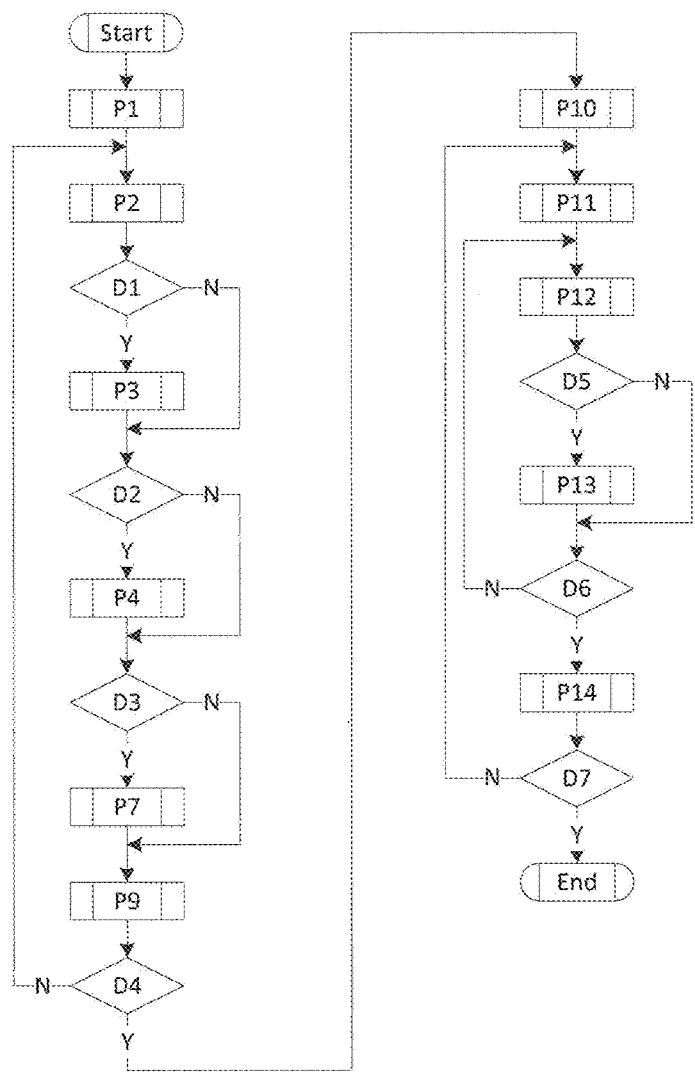

In the following, an example for a method of computing a lookup table is described with reference to the flow diagram of FIG. 29. The process flow shown in FIG. 29 applies to the example of computing the lookup table of FIG. 23.

The process is as follows:

TABLE 8

| Step | Operation performed |
|---|---|
| P1 | Initialization branch/event/data access lookup |
| | set program code address (hereinafter PA) to the lowest program address |
| | clear lookup table (IS_BRANCH = 0, EVENT_ID = 0, ACTION_OFFSET = 0) for all lookup table address (hereinafter LA) |
| P2 | Evaluate instruction at program code address PA |
| | instruction type |
| | direct branch offset |
| | compute corresponding LA (mapping, see claim 7) |
| D1 | Evaluate, if instruction is a direct branch |
| | instruction is a direct branch: Y |
| | instruction is not direct branch: N |
| P3 | Add direct branch information to lookup table at LA |
| | set IS_BRANCH = 1 |
| | compute and set BRANCH_OFFSET |
| D2 | Check, if a predefined event is associated with the current instruction (at PA) |
| | event is associated with current instruction: Y |
| | no event is associated with current instruction: N |
| P5 | Add event information to lookup table at LA |
| | set EVENT_ID = event number |
| D3 | Check, current instruction (at PA) is a data access (R or W) |
| | instruction is a data access: Y |
| | instruction is not a data access: N |
| P7 | Add event information to lookup table at LA |
| | set ACCESS_TYPE = R or W |
| P8 | Add event information to lookup table at LA |
| | set ACCESS_TYPE = 0 |
| P9 | Increment PA by minimal alignment offset |
| | Note: in case of variable instruction length the PA can be a non-aligned address. Also in this case the algorithm can be used, since a non-aligned instruction address will never be called by correct program execution |
| D4 | Check, if program memory end is achieved |
| | PA > highest program address: Y |
| | PA <= highest program address: N |
| P10 | Action offset and instruction length preview initialization |
| | set program code address (hereinafter PA) to the lowest program address |
| P11 | Preview loop initialization |
| | set temporary PA (hereinafter TPA) to PA |
| | set preview index (hereinafter PVI) to 0 |
| P12 | Compute preview instruction length, update TPA and PVI |
| | INSTRUCTION_LENGTH_PREVIEW [PVI] = instruction length of TPA |

TABLE 8-continued

| Step | Operation performed |
|---|---|
| | TPA = TPA + instruction length of TPA<br>PVI = PVI + 1 |
| D5 | Check for action<br>if (PVI == length of INSTRUCTION_LENGTH_PREVIEW) \|\|<br>((ACTION_OFFSET == 0) && (PA != TPA) && ( (IS_BRANCH[TPA] != 0) \|\|<br>(EVENT_ID[TPA] != 0) \|\| (ACCESS_TYPE[TPA] != 0))): Y<br>otherwise: N<br>Comment: action will be set for either the next direct branch, the next event<br>or the next data access. If there is no action within [length of<br>INSTRUCTION_LENGTH_PREVIEW] instructions, action offset will be set<br>to next instruction after [length of INSTRUCTION_LENGTH_PREVIEW]<br>instructions |
| P13 | Set ACTION_OFFSET<br>ACTION_OFFSET[LA] = TPA − PA |
| D6 | Check end of preview loop<br>(PVI == length of INSTRUCTION_LENGTH_PREVIEW field): Y<br>(PVI < length of INSTRUCTION_LENGTH_PREVIEW field): N |
| P15 | Increment PA by minimal alignment offset |
| D7 | Check, if program memory end is achieved<br>PA > highest program address: Y<br>PA <= highest program address: N |

Figure 30:
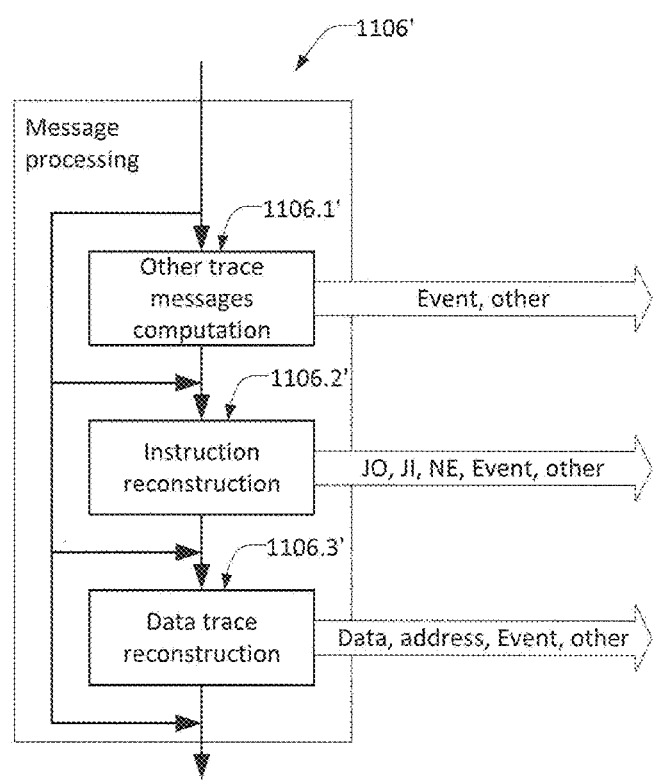
FIG. 30 is a schematic block diagram showing a further embodiment of a message-processing unit of a trace-data processing device, also forming an embodiment of a trace-data processing device of the second kind.

FIG. 30 is a schematic block diagram showing an alternative embodiment of a message-processing unit 1106' of a trace-data processing device.

The data trace allows an observation of addresses and/or values of data that are read and written. In some DUTs, such as those using an ARM CoreSight ETM implementations, there is a difficulty in that a data-trace message does not contain information on whether a data access is a read or write access. In order to determine whether a data access is a read or write access, the preceding instruction has to be analyzed. For an efficient decoding, it is therefore provided in some embodiments to additionally include information in the lookup table indicating that an access is a read or a write access. For instance, an information element IS_WRITE may take on two values, indicating whether or not an access is a write access. If the value indicates that it is not a write access, it must be a read access.

In a parallelized evaluation of the data-trace, a data address sync message may occur within one of the segments to be processed in parallel. Since the subsequent data addresses are output with reference to the data address sync message, to the address indicated by the data address sync message, the corresponding sync addresses as well as the following relative addresses are provided as an output to a subsequent result-consolidation stage. This allows the result consolidation stage determining a base address for evaluating a subsequent segment.

A parallel analysis of those trace messages, which can be evaluated without information on the preceding history, allows achieving a further acceleration of the trace-data processing in comparison with a sequential processing. The following messages can be evaluated without reference to the previous history:

TABLE 9

| Message Type | Description | Previous Messages Required |
|---|---|---|
| Alignment synchronization | Provides alignment by defining a starting point of the message evaluation in the trace-data stream | No |
| Ownership trace message | Task/process ID | No |
| Watchpoint message | Watchpoint indication | No |
| Hardware-supported instrumentation | Output of information via the trace port and controlled by the application (hardware-supported printf( )) | No |
| Instruction trace/synchronization | Absolute instruction address (provided periodically) | No |
| Instruction trace/direct branches | Information whether an instruction or a branch were executed or not | Yes (all instruction trace messages up to the last instruction synchronization) |
| Instruction trace/indirect branches | Offset of an indirect jump | Yes (all instruction trace messages up to the last instruction synchronization) |
| Data-trace message | Read/write data access | Yes (previous data-traces; in case of ETM: Instruction trace allowing determination of access type). |

Processing of Other Trace Messages

A parallel evaluation of the data-trace and those trace messages that do not require the previous history for their evaluation is in one embodiment without evaluation of instruction traces. If the instruction trace is also evaluated, the evaluation of other trace message types is preferably also included in the evaluation of the instruction traces. This allows reconstructing an exact order of the individual events in the DUT that cause the respective messages. The message processing stage 1106' of FIG. 30 therefore provides three different processing blocks 1106'.1, 1106'.2 and 1106'.3. The first block 1106'.1 serves for the computation of other trace messages as described, the second block 1106'.2 performs an instruction reconstruction, and a third block 1106'.3 performs a data-trace reconstruction. All blocks operate in parallel.

The message-processing unit of FIG. 30 also forms an embodiment of the trace-data processing device of the second kind mentioned earlier. However, in this case, the processing block 1106.2' is only an optional component.

With reference to the FIGS. 31 to 33, further embodiments of a trace-data processing device will be described that include an analysis unit for automatically analyzing the decompressed and processed trace-data provided by the trace-data processing device stages illustrated in FIG. 11.

Figure 31:
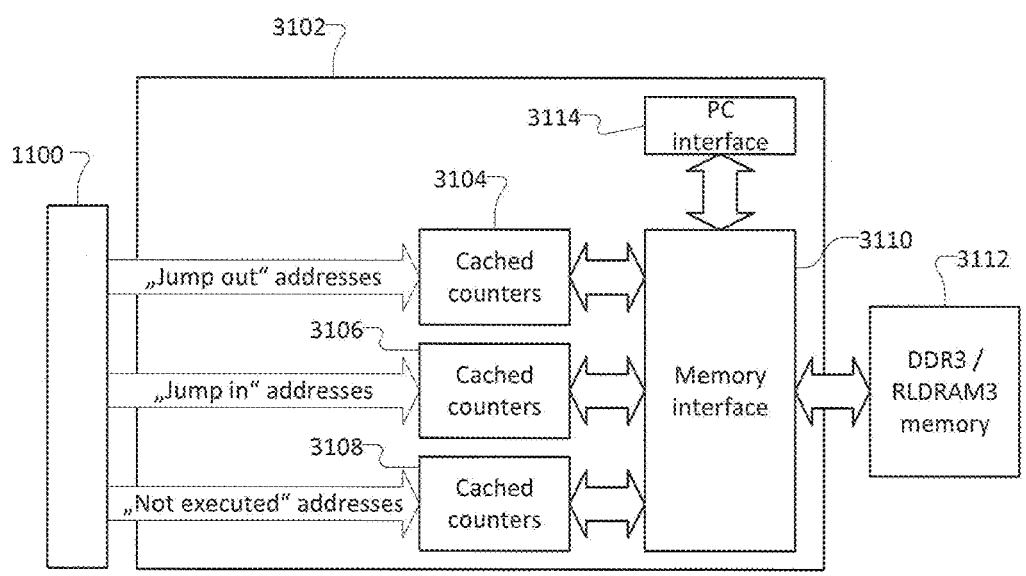
FIG. 31 is a schematic block diagram illustrating a trace-data processing apparatus that, in addition to a trace-data processing device, comprises an analysis unit.

FIG. 31 is a schematic block diagram illustrating a trace-data processing apparatus 3100 that, in addition to the trace-data processing device 1100, comprises an analysis unit 3102. The analysis unit 3102 serves for an automatic evaluation of the runtime information data representing the (at least partial) reconstruction of the program execution flow performed by a DUT (which is not shown in the present illustration). In the present embodiment, the analysis unit 3102 comprises cached counters 3104, 3106 and 3108, which are arranged in parallel to each other and receive individual input from the trace-data processing device 1100. The cached counter 3104 receives jump-out addresses. The cached counter 3106 receives jump-in addresses. And the cached counter 3108 receives not-executed addresses. The three cached counters 3104 to 3108 are connected to a memory interface 3110, which interfaces with an external high-performance memory, such as a DDR3 or RLDRAM3 memory 3112. The memory interface 3110 further interfaces to an external computer of a developer's system that may be connected via an PC interface 3114, such as USB or Ethernet.

The functionality of the cached counters will be explained in the following with reference to the illustration shown in the lower part of FIG. 31. Each incoming address results in an entry in the respective cached counter, as long as its cache is not full. In case the same address is provided a second time at the input to a respective cached counter, a corresponding count register is incremented. In case a respective cache is full and a new entry needs to be entered, a read-modify-write access to the connected high-performance memory 3112 is performed. The high-performance memory 3112 allocates a stored register value to each instruction address. The stored information for a given address is read from the memory, added to the currently buffered value of the count register in the cache and written back to the high-performance memory 3112.

In order to increase the performance of this process, the individual cached counters are provided and operated in form of a plurality of counters. To access the results, the sum of the values of counters of the same type can be calculated.

Since, in the course of a profiling process, an analysis of the instruction coverage and of the decision coverage, only a number occurrence of the individual instructions in the program-execution flow or the number of performed jumps are relevant, the results of the individual counter caches can simply be added for the subsequent analysis.

Figure 32:
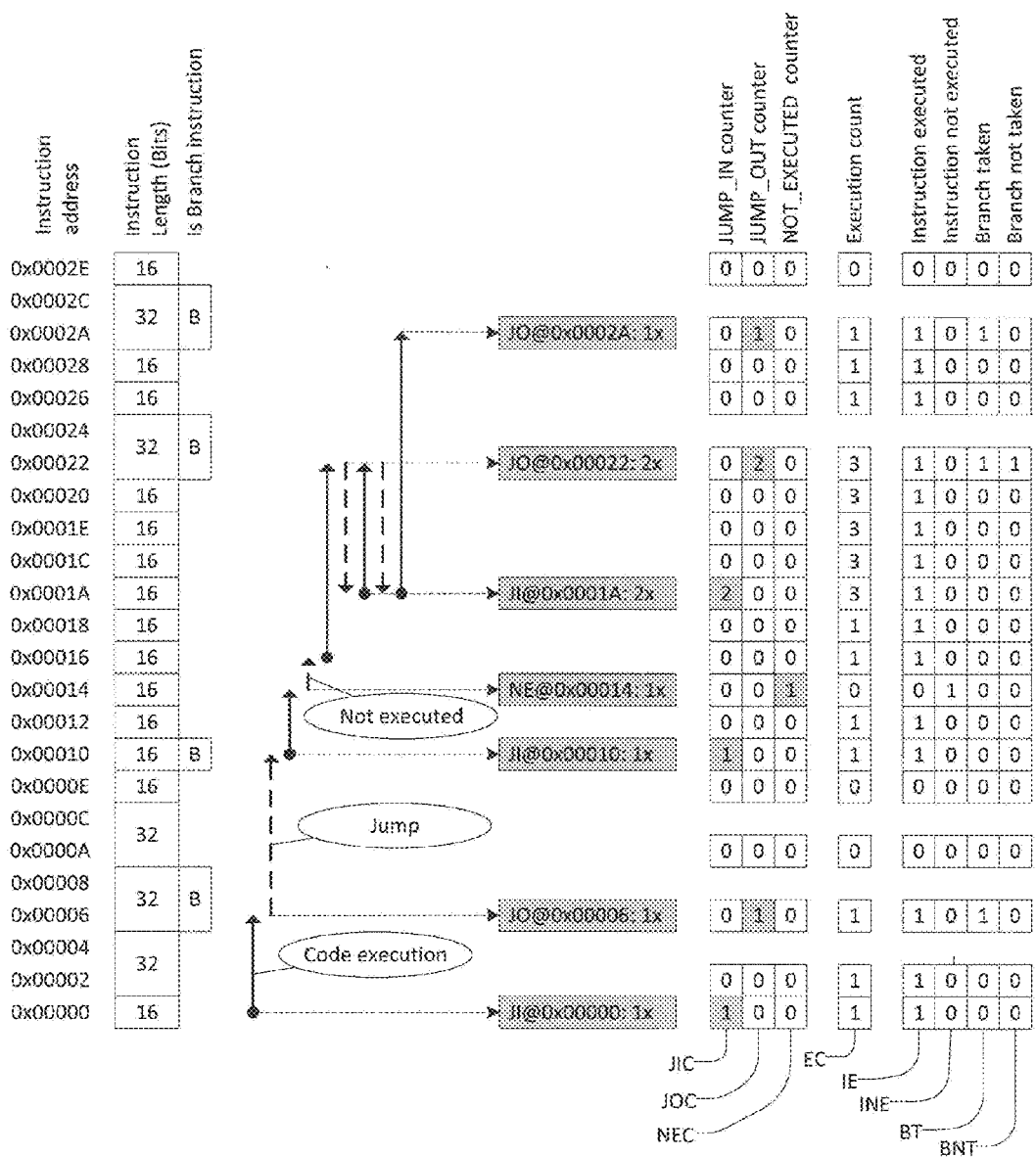
FIG. 32 is an illustration of a method for determining a count of performed instructions and of determining an instruction and branch coverage by accumulation of the instruction address specific count of jump-in to, jump-out from as well as the conditionally non-execution of the specific instruction.

FIG. 32 is an illustration of a method for determining the count of performed instructions and of determining an instruction/branch coverage by accumulation of jump-in, jump-out as well as addresses of non-executed instructions. The addresses used in this example are mapped addresses, similar to the mapping according FIG. 18.

Initially, the observed sequence will start with a jump to address 0x00000. A "JUMP_IN" event for address 0x00000 will be generated, which increments the "JUMP_IN" counter at address 0x00000 (hereinafter JI@0x00000).

At address 0x00006 a branch occurs, which is formed by a jump to address 0x00010. Accordingly, for address 0x00006 a "JUMP_OUT" event will be generated, which increments the "JUMP_OUT" counter at address 0x00006 (hereinafter JO@0x00006). Additionally, a JI@0x00010 will be generated.

The program execution then continues from address 0x00010. The instruction at address 0x00014 is not executed. Accordingly, for address 0x00014 a "NOT_EXECUTED" event will be generated, which increments the "NOT_EX-ECUTED" counter at address 0x00014 (hereinafter NE@0x00014).

The program execution continues up to address 0x00022, where a loop occurs, which will be executed twice. The loop performs a jump back to address 0x0001A. This results in the events JO@0x00022, JI@0x0001A, JO@0x00022 and JI@0x0001A.

After that, the program execution continues up to address 0x0002A, where a jump out from the observed instruction memory region occurs (JO@0x0002A).

The values of the three counter tables after execution of the described program sequence are listed in the tables 3210, 3212 and 3214.

The results of execution count are stored in a table EC. Each row of the table corresponds to a mapped program code address and contains the number of executions of the corresponding instruction.

Other tables IE, INE, BT and BNT provide information which are necessary for branch coverage analysis. The tables include the following information

- Instruction executed table IE: "1" indicates the execution of the instruction at least one time, otherwise "0"
- Instruction not executed table INE: "1" indicates the non-execution of the instruction at least one time. The instruction has a built-in condition test, which controls the execution of the instruction, and the condition test fails. Otherwise "0"
- Branch taken table BT: "1" indicates that the instruction is a branch and the branch occurred at least one time, otherwise "0"
- Branch not taken table BNT: "1" indicates that the instruction is a branch and the branch was not taken at least one time, otherwise "0"

Figure 33:
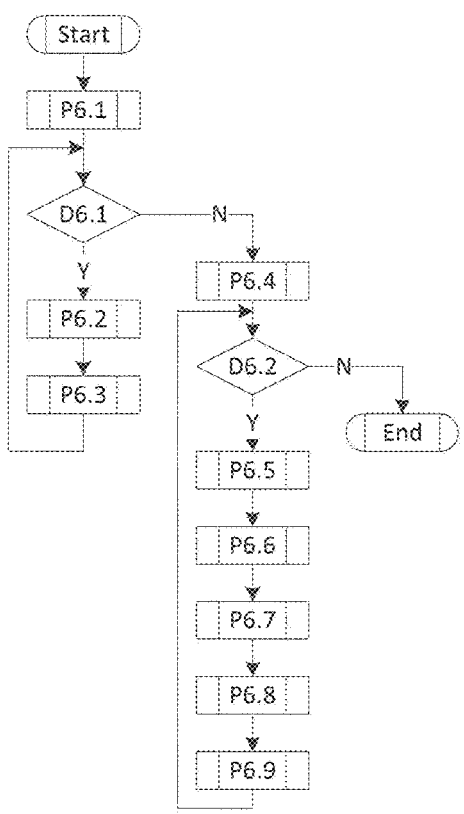
FIG. 33 is a flow diagram of algorithms and methods for computing execution count and branch coverage information based on the example shown in FIG. 32.

The computation of the execution count for each instruction address can be done as shown in FIG. 33:

TABLE 10

| Step | Operation performed |
|---|---|
| P6.1 | Initialization (for execution counter)<br>set all rows of EC to 0<br>Set all rows of BC to N<br>if there are multiple instances of each counter table 3210, 3212 and 3214, merge the values |

TABLE 10-continued

| Step | Operation performed |
|---|---|
| | set a temporary counter TC to 0 |
| | set a temporary address pointer PA to the lowest observed program address |
| D6.1 | Check, if program memory end is not achieved<br>PA > highest observed program address: N<br>PA <= highest observed program address: Y |
| P6.2 | Compute "Jump_in"/"Jump out" value<br>TC = TC + JI[PA] − JO[PA] |
| P6.3 | Compute "Not executed" value<br>EC [PA] = TC − NEC[PA]<br>PA = PA + instruction width (bytes) |
| P6.4 | Initialization (for branch coverage)<br>Set all rows of BC to N<br>set PA to the lowest observed program address |
| D6.2 | Check, if program memory end is not achieved<br>PA > highest observed program address: N<br>PA <= highest observed program address: Y |
| P6.5 | Set "Instruction executed" entry<br>IE[PA] = (EC[PA] > 0) ? 1:0 |
| P6.6 | Set "Instruction not executed" entry<br>INE[PA] = (NE [PA] > 0) ? 1:0 |
| P6.7 | Set "Branch taken" entry<br>BT[PA] = (JOC[PA] > 0) ? 1:0 |
| P6.8 | Set "Branch not taken" entry<br>BNT[PA] = ((EC[PA] − JOC[PA]) > 0) ? 1:0 |
| P6.9 | Increment PA<br>PA = PA + instruction width (bytes) |

What is claimed is:

1. A trace-data processing device, comprising
an input, which is configured to receive at least one source-specific trace data stream that comprises trace messages carrying encoded execution-flow information on a program execution flow performed by a source device under test or under observation, hereinafter DUT;
a trace-data processing unit, which is configured to derive runtime information from the trace data stream, the runtime information being associated with the program execution flow performed by the DUT,
wherein the trace-data processing unit comprises a message-distribution stage, a plurality of parallel message-processing stages, and a result consolidation stage connected with the message-processing stages,
wherein the message-distribution stage is configured to distribute the trace data stream over the message-processing stages in the form of respective trace data sequences that include at least one trace message,
wherein the message-processing stages are each configured to generate decoded runtime information sequences from the trace data sequences, the decoded runtime information sequences being associated with a respective section of the program execution flow performed by the DUT,
wherein the result-consolidation stage is configured to receive the decoded runtime information sequences generated by the message-processing stages and to compose and provide at its output runtime information data representing an at least partial reconstruction of the program execution flow performed by the DUT.

2. The trace-data processing device of claim 1,
wherein the trace-data processing unit further comprises a pre-processing stage that is configured to determine starting points of the trace messages or identify in the trace data stream instruction synchronization messages encoding absolute instruction addresses of instructions executed by the DUT, and to provide at its output side channel information that is associated with the trace data stream and indicative of positions of instruction synchronization messages in the trace data stream, wherein the message-distribution stage is configured to form, using the side channel information, the trace data sequences such that each trace data sequence includes at least one instruction synchronization message,
the trace-data processing stages are additionally configured to determine, using the absolute instruction addresses provided by the instruction synchronization messages in the received trace data sections, the absolute instruction addresses of those instructions executed during the program execution flow.

3. The trace-data processing device of claim 2, wherein
the input is configured to receive and internally forward the received trace data stream comprising the trace messages carrying the execution-flow information in compressed form, and wherein the trace-data processing unit is configured to decompress the execution-flow information using prestored reconstruction information, which comprises a representation of at least a fraction of a copy of a memory content of a memory of the DUT, the memory content representing
program code executable by the DUT, OR
prestored reconstruction information includes at least
a) branch-instruction information indicative of that an instruction at a respective current instruction address is a branch instruction, which is any instruction that controls the flow of program execution to proceed with an instruction other than a respective next instruction in the executable program code,
b) for a branch instruction at a respective current instruction address: branch-offset information indicative of at least one of the following:
an address offset between the respective current instruction address and an instruction to be jumped to from the respective current instruction address in the program execution flow, or
an instruction offset between the respective current instruction and an instruction to be jumped to from the respective current instruction in the program execution flow, and
c) data-access information regarding the instruction at the current instruction address and indicative of only one of a read-type and a write-type, with respect to a data access to be executed by the DUT to a data memory of the DUT,
and wherein, at least in case the DUT uses an instruction set with variable length, the branch-offset information additionally includes length information indicative of lengths of those instructions between the current instruction and the instruction to be jumped to and the message-processing stage is configured to decode the length information and to refrain from accessing the reconstruction memory for determining instruction lengths of those instructions covered by the length information.

4. The trace-data processing device of claim 3, wherein the reconstruction information is prestored in mapped form in a coherent memory-address range of a reconstruction memory that is either internal or external to the trace-data processing device, and wherein the trace-data processing unit comprises a mapper, which is connected with the trace-data processing stages and configured to map the instruction addresses received from the trace-data processing stages to the coherent memory-address range of the memory.

5. The trace-data processing device of claim 3, wherein each message-processing stage is configured to determine from the received at least one instruction synchronization message the respective instruction address, and to determine from the received at least one trace message and provide as an output the runtime information sequences in the form of at least one of a Jump-in information element, a Jump-out information element, or a Not-executed information element in combination with a respective instruction address, to which the respective information element is allocated.

6. The trace-data processing device of claim 3, wherein
the reconstruction information additionally comprises event information indicative of an identification of an event, to which an execution of the instruction at the current instruction address is allocated in accordance with a prestored list of events, and wherein
each message-processing stage is configured to additionally determine from the received trace message, using the reconstruction information and the list of events, any event formed by an executed instruction currently processed, and to provide an event identification element in association with the instruction execution information for the respective executed instruction in the runtime information section.

7. The trace-data processing device of claim 3, wherein the reconstruction information additionally comprises action-offset information associated with each instruction address, the action-offset information being indicative of
either an instruction address offset between the current instruction address and an instruction address of a next branch instruction, of a next data-access instruction or of a next event, in accordance with the event information, in the program execution flow,
or an instruction offset corresponding to the number of instructions between the current instruction and a next branch instruction, a next data-access instruction or a next event in the program execution flow, and wherein
each message-processing stage is configured to determine from the action-offset information that is associated with a currently processed instruction an instruction address of an instruction to be processed next by the message-processing stage.

8. The trace-data processing device of claim 3, wherein the message-processing stages are configured to generate and provide at their output the runtime information comprising at least one of the following information:
jump-out information indicative of an instruction address of an instruction that executed a jump out;
jump-in information indicative of an instruction address of an executed instruction subject to a jump in;
not-executed information indicative of an instruction address of a non-executed instruction;
event information indicative of an instruction address of a predefined event executed in the program execution flow;
waypoint information indicative of an instruction address of a waypoint in the program execution flow;
clock-cycle information indicative of a number of processor clock cycles of the DUT between two executed events;
a current context identifier of an instruction executed;
a current instruction set to which an instruction executed belongs;
any exception detected in executing a given instruction;
timestamps associated with instructions; and
a data trace comprising a value, a memory address and an access type, read or write, associated with a memory access.

9. The trace-data processing device of claim 1, wherein
the message-distribution stage is configured to assign a unique sequence identifier to each of the distributed trace data sequences and to distribute the trace data sequences to a plurality of parallel buffer memories, which are connected on their output side with the message-processing stages, and to select a respective buffer memory for a given trace data sequence from those of the buffer memories, which currently have buffer-capacity for the given trace data sequence, and wherein
the message-processing stages are configured to provide at their output side the respective sequence identifier in association with the runtime information sequence determined from a given trace data sequence received on their input side, and wherein
the message-processing stages are configured to indicate to the result-consolidation stage an availability of at least one generated runtime information sequence identifier.

10. The trace-data processing device of claim 2, wherein the pre-processing stage comprises
a speculative-message-computing stage that comprises a group of N parallel data evaluators and that is configured to receive a sequence of the trace data stream and to evaluate the given sequence of the trace data stream using the data evaluators in the form N partially overlapping evaluation windows that together cover the given sequence of the trace data stream, beginning with an evaluation starting point of a first one of the evaluation windows,
wherein each of the data evaluators is configured to evaluate in its respective evaluation window a respective subsection of the given section starting with a predefined respective offset evaluation starting point with respect to its next neighbouring evaluation window and having a width, which is equal to or larger than a predefined maximum message length, wherein the offset between the evaluation starting points of next neighbouring evaluation windows is one data step size, in particular 1 Byte,
wherein each data evaluator is configured to perform, for its given evaluation window, a message-type identification algorithm on the respective subsection beginning from the respective offset evaluation starting point, and to provide as an output either a message-type indicator, which is indicative of a message type that has been successfully identified as beginning with the respective offset starting point, which thus forms a message starting point, or an indicator of a message-identification failure,
and wherein the pre-processing stage further comprises a message-starting-point computing stage, which is configured to
receive the outputs of the speculative-message-computing stage and detect message-type indicators of predefined messages including at least an alignment synchronization message, which indicates a suitable starting point for message evaluation in the trace data stream, and associated message starting points received from the speculative-message-computing stage for a respective current sequence of the trace data stream,
determine predefined message lengths associated with the currently detected synchronization message types in units of data step size,
determine offset starting points of respective next messages in the trace data stream,
determine a carry value corresponding to a difference between the length of the identified message closest to an end point of the currently processed sequence and a distance, in terms of data step size, between the offset starting point of this identified message and the end point of the currently processed sequence, and to determine the starting point of a next message in a next sequence of the trace data stream from the carry value.

11. The trace-data processing device of claim 10, wherein the pre-processing stage is configured to pipeline the pre-processing of consecutive sequence of the incoming trace data stream in consecutive pipe stages of a pre-processing pipeline, wherein each pipe stage comprises a speculative-message-computing stage and a message-starting point computing stage, and wherein the message-starting point computing stages of the pipe stages are configured to provide the carry value and an indicator of detection of an alignment synchronization message in the respective sequence of the trace data stream as an output to the respective next pipe stage.

12. The trace-data processing device of claim 1, further comprising a frame processing unit, which is arranged upstream from the trace-data processing unit and which is configured to receive a serial comprehensive trace data stream that includes a plurality of source-specific trace data streams originating from more than one trace data source, locate predefined source identifiers in the comprehensive trace data stream and extract the trace data allocated thereto so as to form a plurality of source-specific trace data streams, internally align at least one of the source-specific trace data streams so as to remove any gaps caused by extracting sections of the trace data stream originating from a respective other trace data source, and provide at its output separate the trace data streams for each respective trace data source.

13. The trace-data processing device of claim 2, wherein the prestored reconstruction information is provided in redundant instances in a memory unit comprising the reconstruction memory in the form of a plurality of parallel memory banks or memory devices, and wherein a memory-arbiter is connected between the trace-data-processing unit and the memory unit and configured to serve simultaneous access requests received from the message-processing stages by controlling a plurality of simultaneous accesses to the different instances of the different instances of the reconstruction information, and wherein the memory unit comprises a cache unit with a plurality of parallel cache memories configured to cache redundant instances of a fraction the reconstruction information stored in the reconstruction memory, and wherein a cache-arbiter is connected between the trace-data-processing unit and the cache unit and configured to serve simultaneous access requests received from the message-processing stages by controlling a plurality of simultaneous accesses to the different instances of the different instances of the fraction of the reconstruction information.

14. The trace-data-processing device of claim 1, further comprising a profiling unit, which is connected with the result-consolidation unit and configured to determine from the received runtime information, profiling information comprising at least a number of repetitions of execution of instructions at predetermined instruction addresses in the program execution flow performed by the DUT, wherein the trace-data-profiling unit comprises a cache counter unit and is configured to perform cache write and cache rewrite operations of counts of execution associated with instruction addresses executed to the cache counter unit, and upon detecting that no cache capacity exists for a current cache write operation, initiate a memory write or memory rewrite operation to an external memory for that count, which is associated with that instruction address that has not been counted for the longest time span, and to then overwrite that count by the current cache write operation, and wherein the cache counter unit has a plurality of parallel counter caches, and wherein the trace-data-profiling unit is configured to perform cache write and cache rewrites for counts related with the same instruction address to different ones of the counter caches, and to add all those cache counts from the different counter caches that are associated with the same instruction address before initiating a memory write or memory rewrite operation in order to determine a currently cached total count with respect to that instruction address.

15. The trace-data-processing device of claim 1, further comprising a runtime information processing unit, which includes programmable units and is communicatively connected with the result-consolidation unit and with a debug server or control outputs of the trace-data-processing device, and which is configured to determine, from the received runtime information, system states of the DUT and to select and induce, in dependence on the determined system states, control operations by the debug server on the DUT or influence operation of the DUT via the control outputs.

* * * * *